US011079271B2

(12) United States Patent
Takumi et al.

(10) Patent No.: US 11,079,271 B2
(45) Date of Patent: *Aug. 3, 2021

(54) POSITION DETECTION SENSOR THAT DETECTS AN INCIDENT POSITION OF LIGHT COMPRISING PLURAL PIXEL GROUPS EACH WITH PLURAL PIXEL PARTS

(71) Applicant: HAMAMATSU PHOTONICS K.K., Hamamatsu (JP)

(72) Inventors: Munenori Takumi, Hamamatsu (JP); Haruyoshi Toyoda, Hamamatsu (JP); Yoshinori Matsui, Hamamatsu (JP); Kazutaka Suzuki, Hamamatsu (JP); Kazuhiro Nakamura, Hamamatsu (JP); Keisuke Uchida, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/647,492

(22) PCT Filed: Aug. 21, 2018

(86) PCT No.: PCT/JP2018/030847
§ 371 (c)(1),
(2) Date: Mar. 14, 2020

(87) PCT Pub. No.: WO2019/058843
PCT Pub. Date: Mar. 28, 2019

(65) Prior Publication Data
US 2020/0271512 A1 Aug. 27, 2020

(30) Foreign Application Priority Data
Sep. 20, 2017 (JP) .............................. JP2017-180101

(51) Int. Cl.
*H01L 27/144* (2006.01)
*G01J 1/44* (2006.01)
(Continued)

(52) U.S. Cl.
CPC ............ *G01J 1/44* (2013.01); *H01L 27/1446* (2013.01); *H01L 31/02024* (2013.01);
(Continued)

(58) Field of Classification Search
CPC ......... H01L 27/14605; H01L 27/14623; H01L 31/02024; H01L 31/02164;
(Continued)

(56) References Cited

U.S. PATENT DOCUMENTS 5,547,879 A    8/1996  Dierschke et al.
10,205,901 B2 * 2/2019  Murata ............. H01L 27/14634
10,819,932 B2 * 10/2020 Takumi ................. G01J 1/0418

FOREIGN PATENT DOCUMENTS

JP    S58-190710 A    11/1983
JP    S62-123784 A    6/1987
(Continued)

OTHER PUBLICATIONS

International Preliminary Report on Patentability dated Apr. 2, 2020 for PCT/JP2018/030847.

*Primary Examiner* — Que Tan Le
(74) *Attorney, Agent, or Firm* — Faegre Drinker Biddle & Reath LLP

(57) ABSTRACT

Provided is a position detection sensor. In a first pixel part, as an incident position is closer to a first end of a first pixel pair group in a second direction, an intensity of a first electric signal decreases. In a second pixel part, as the incident position is closer to the first end, an intensity of a second electric signal increases. In a third pixel part, as the incident position is closer to a second end of a second pixel
(Continued)

pair group in a first direction, an intensity of a third electric signal decreases. In a fourth pixel part, as the incident position is closer to the second end, an intensity of a fourth electric signal increases. A calculation unit calculates a second position on the basis of the first and second electric signals, and calculates a first position on the basis of the third and fourth electric signals.

7 Claims, 18 Drawing Sheets

(51) Int. Cl.
*H01L 31/02* (2006.01)
*H01L 31/0216* (2014.01)

(52) U.S. Cl.
CPC .. *H01L 31/02164* (2013.01); *H01L 31/02165* (2013.01); *G01J 2001/448* (2013.01)

(58) Field of Classification Search
CPC ......... H01L 31/02165; H01L 27/14603; H01L 31/16; H01L 27/14621; H01L 27/14636; H01L 27/146; H01L 27/14643; H01L 31/02; H01L 27/1446; G01J 1/02; G01J 1/0418; G01J 1/1626; G01J 1/4228; G01J 1/44
USPC .......................................... 250/208.1, 214 R
See application file for complete search history.

(56) References Cited

FOREIGN PATENT DOCUMENTS

| JP | S63-212832 A | 9/1988 |
|---|---|---|
| JP | H03-34369 A | 2/1991 |
| JP | H10-027895 A | 1/1998 |
| JP | WO-2015/046045 A1 | 4/2015 |

* cited by examiner

POSITION DETECTION SENSOR THAT DETECTS AN INCIDENT POSITION OF LIGHT COMPRISING PLURAL PIXEL GROUPS EACH WITH PLURAL PIXEL PARTS

TECHNICAL FIELD

The present disclosure relates to a position detection sensor.

BACKGROUND ART

Patent Literature 1 discloses an optical semiconductor integrated circuit that detects incident light. In the optical semiconductor integrated circuit, optical elements for light detection is disposed in four regions which are aligned around any central point. The optical semiconductor integrated circuit detects a two-dimensional position to which light is incident by comparing outputs from the optical elements.

CITATION LIST

Patent Literature

Patent Literature 1: Japanese Unexamined Patent Publication No. H10-27895
Patent Literature 2: Japanese Unexamined Patent Publication No. H3-34369

SUMMARY OF INVENTION

Technical Problem

For example, as a position detection sensor capable of being used for detecting a two-dimensional position to which a light spot is incident in an optical control field, for example, a profile sensor or a position detection sensor using a four-division photodiode (hereinafter, simply referred to as four-division photodiode) can be exemplified. In the profile sensor, a projection image in a column direction is acquired by electric signals output from pixels which are wired to each other for every column among two-dimensionally arranged pixels, and a projection image in a row direction is acquired by electric signals output from pixels which are wired to each other for every row. In addition, the profile sensor detects a two-dimensional position to which a light spot is incident by using the projection images. However, in the profile sensor, many electric signals are read out to obtain the projection images, and thus there is a tendency that time is further taken in reading-out of the output electric signals in comparison to the four-division photodiode in which only four electric signals are read out. Accordingly, in the profile sensor, it is difficult to detect the two-dimensional position to which the light spot is incident at a higher speed in comparison to the four-division photodiode.

In contrast, in the four-division photodiode, four electric signals are read out from four pixels which are arranged in a first quadrant to a fourth quadrant centering around the origin, and the two-dimensional position to which the light spot is incident is detected by taking a ratio of the electric signals. In the four-division photodiode, the number of electric signals which are read out is smaller in comparison to the profile sensor, and thus it is possible to further suppress time necessary for reading-out of the electric signals. According to this, it is possible to detect the two-dimensional position to which the light spot is incident at a high speed. However, in the four-division photodiode, it is necessary to use the ratio of the four electric signals which are respectively output from the four pixels so as to calculate the two-dimensional position. Accordingly, in the four-division photodiode, the number of pixels is limited to four, and it is necessary for the light spot to be incident to all of the four pixels. In a case where the size of a spot diameter of light that is incident to the four-division photodiode is small, the light may not be incident to any one of the four pixels. Accordingly, there is a concern that it is difficult to calculate the two-dimensional position by using the ratio of the charge signals. In addition, in a case where the light spot is incident to a position that is distant from the center of the four-division photodiode, linearity of an intensity difference between the electric signals deteriorates, and thus it is difficult to detect the two-dimensional position with accuracy. Accordingly, a movement range of spot light for which position detection is possible in principle is limited to approximately a diameter of the spot light, and a range in which position detection can be performed with accuracy is set to approximately a radius of the spot light.

An object of the present disclosure is to provide a position detection sensor capable of detecting a two-dimensional position to which light is incident with accuracy and at a high speed even in a case where a spot diameter of incident light is small.

Solution to Problem

According to an embodiment of the present disclosure, there is provided a position detection sensor that detects an incident position of light. The position detection sensor includes: a first pixel pair group including a plurality of first pixel pairs arranged along a first direction, each of the first pixel pairs that includes a first pixel part that generates a first electric signal corresponding to an incident light amount of the light and a second pixel part that is disposed side by side with the first pixel part in the first direction and generates a second electric signal corresponding to an incident light amount of the light; a second pixel pair group that includes a plurality of second pixel pairs arranged along a second direction, each of the second pixel pairs including a third pixel part that generates a third electric signal corresponding to an incident light amount of the light and a fourth pixel part that is disposed side by side with the third pixel part in the second direction intersecting the first direction and generates a fourth electric signal corresponding to an incident light amount of the light, and the second pixel pair group intersecting the first pixel pair group; and a calculation unit that calculates a first position that is the incident position in the first direction, and a second position that is the incident position in the second direction. In the first pixel part, as the incident position is closer to a first end of the first pixel pair group in the second direction, an intensity of the first electric signal decreases. In the second pixel part, as the incident position is closer to the first end in the second direction, an intensity of the second electric signal increases. In the third pixel part, as the incident position is closer to a second end of the second pixel pair group in the first direction, an intensity of the third electric signal decreases. In the fourth pixel part, as the incident position is closer to the second end in the first direction, an intensity of the fourth electric signal increases. The calculation unit calculates the second position on the basis of an integrated value of the intensity of the first electric signal and an integrated value of the intensity of the second electric signal, and calculates the first position on the basis of an integrated value of the intensity of the third electric signal and an integrated value of the intensity of the fourth electric signal.

In the position detection sensor, when a light spot is incident to the first pixel pair group, the calculation unit calculates the second position that is the incident position of the light in the second direction on the basis of the integrated value of the first electric signal (for example, a charge signal) generated in the first pixel part, and the integrated value of the second electric signal (for example, a charge signal) that is generated in the second pixel part. On the other hand, when the light spot is incident to the second pixel pair group, the calculation unit calculates the first position that is the incident position of the light in the first direction on the basis of the integrated value of the third electric signal (for example, a charge signal) generated in the third pixel part, and the integrated value of the fourth electric signal (for example, a charge signal) that is generated in the fourth pixel part. As described above, the calculation unit collectively reads out the electric signals instead of reading out the intensity of the electric signal for every pixel part (that is, the first pixel part, the second pixel part, the third pixel part, and the fourth pixel part), and calculates the first position and the second position on the basis of the integrated values of the intensities of the electric signals. Accordingly, according to the position detection sensor, it is possible to detect the first position and the second position at a higher speed in comparison to a profile sensor that reads out the intensity of the electric signal for every pixel. In addition, in the position detection sensor, it is possible to dispose many pixel parts in comparison to a four-division photodiode. Accordingly, even in a case where a spot diameter of light is small, it is possible to calculate a two-dimensional position to which the light spot is incident on the basis of the output electric signals by adjusting the size and arrangement of the pixel parts. In addition, it is possible to suppress occurrence of a problem in which the intensity of the electric signal that is incident to each pixel part is greatly biased in accordance with the incident position of the light spot through the adjustment. As a result, it is possible to detect the first position and the second position with accuracy regardless of the incident position of the light spot.

In the position detection sensor, the first pixel pair group may further include a first transmission filter which covers the first pixel part and through which the light is transmitted, and a second transmission filter which covers the second pixel part and through which the light is transmitted, the second pixel pair group may further include a third transmission filter which covers the third pixel part and through which the light is transmitted, and a fourth transmission filter which covers the fourth pixel part and through which the light is transmitted, a transmittance of the light in the first transmission filter may decrease as it is closer to the first end in the second direction, a transmittance of the light in the second transmission filter may increase as it is closer to the first end in the second direction, a transmittance of the light in the third transmission filter may decrease as it is closer to the second end in the first direction, and a transmittance of the light in the fourth transmission filter may increase as it is closer to the second end in the first direction. When first pixel pair group includes the first transmission filter and the second transmission filter, the following operation is obtained. Specifically, in the first pixel part, as the incident position is closer to the first end in the second direction, the incident light amount of the light that is incident to the first pixel part decreases, and according to this, the intensity of the first electric signal generated in the first pixel part also decreases. In contrast, in the second pixel part, as the incident position is closer to the first end in the second direction, the incident light amount of the light that is incident to the second pixel part increases, and according to this, the intensity of the second electric signal generated in the second pixel part also increases. Accordingly, according to this configuration, it is possible to appropriately realize the first pixel pair group of the position detection sensor. In addition, when the second pixel pair group includes the third transmission filter and the fourth transmission filter, the following operation is obtained. Specifically, in the third pixel part, as the incident position is closer to the second end in the first direction, the incident light amount of the light that is incident to the third pixel part decreases, and according to this, the intensity of the third electric signal generated in the third pixel part also decreases. In contrast, in the fourth pixel part, as the incident position is closer to the second end in the first direction, the incident light amount of the light that is incident to the fourth pixel part increases, and according to this, the intensity of the fourth electric signal generated in the fourth pixel part also increases. Accordingly, according to this configuration, it is possible to appropriately realize the second pixel pair group of the position detection sensor.

In the position detection sensor, the first pixel pair group may further include a first light-shielding part that covers another portion of the first pixel part excluding one portion of the first pixel part and shields the light, and a second light-shielding part that covers another portion of the second pixel part excluding one portion of the second pixel part and shields the light, and the second pixel pair group may further include a third light-shielding part that covers another portion of the third pixel part excluding one portion of the third pixel part and shields the light, and a fourth light-shielding part that covers another portion of the fourth pixel part excluding one portion of the fourth pixel part and shields the light. A width of the one portion of the first pixel part in the first direction may decrease as it is closer to the first end in the second direction, a width of the one portion of the second pixel part in the first direction may increase as it is closer to the first end in the second direction, a width of the one portion of the third pixel part in the second direction may decrease as it is closer to the second end in the first direction, and a width of the one portion of the fourth pixel part in the second direction may increase as it is closer to the second end in the first direction. When the first pixel pair group includes the first light-shielding part and the second light-shielding part, in the first pixel part, as the incident position is closer to the first end in the second direction, the incident light amount of the light that is incident to the first pixel part decreases, and according to this, the intensity of the first electric signal generated in the first pixel part also decreases. In contrast, in the second pixel part, as the incident position is closer to the first end in the second direction, the incident light amount of the light that is incident to the second pixel part increases, and according to this, the intensity of the second electric signal generated in the second pixel part also increases. Accordingly, according to this configuration, it is possible to appropriately realize the first pixel pair group of the position detection sensor. In addition, when the second pixel pair group includes the third light-shielding part and the fourth light-shielding part, in the third pixel part, as the incident position is closer to the second end in the first direction, the incident light amount of the light that is incident to the third pixel part decreases, and according to this, the intensity of the third electric signal generated in the third pixel part also decreases. In contrast, in the fourth pixel part, as the incident position is closer to the second end in the first direction, the incident light amount of the light that is incident to the fourth pixel part increases, and according to this, the intensity of the fourth electric signal generated in the fourth pixel part also increases. Accordingly, according to this configuration, it is possible to appropriately realize the second pixel pair group of the position detection sensor.

In the position detection sensor, a width of the first pixel part in the first direction may decrease as it is closer to the first end in the second direction, a width of the second pixel part in the first direction may increase as it is closer to the first end in the second direction, a width of the third pixel part in the second direction may decrease as it is closer to the second end in the first direction, and a width of the fourth pixel part in the second direction may increase as it is closer to the second end in the first direction. When the first pixel pair group includes the first pixel part and the second pixel part, the following operation is obtained. Specifically, in the first pixel part, as the incident position is closer to the first end in the second direction, the incident light amount of the light that is incident to the first pixel part decreases, and according to this, the intensity of the first electric signal generated in the first pixel part also decreases. In contrast, in the second pixel part, as the incident position is closer to the first end in the second direction, the incident light amount of the light that is incident to the second pixel part increases, and according to this, the intensity of the second electric signal generated in the second pixel part also increases. Accordingly, according to this configuration, it is possible to appropriately realize the first pixel pair group of the position detection sensor. In addition, when the second pixel pair group includes the third pixel part and the fourth pixel part, the following operation is obtained. Specifically, in the third pixel part, as the incident position is closer to the second end in the first direction, the incident light amount of the light that is incident to the third pixel part decreases, and according to this, the intensity of the third electric signal generated in the third pixel part also decreases. In contrast, in the fourth pixel part, as the incident position is closer to the second end in the first direction, the incident light amount of the light that is incident to the fourth pixel part increases, and according to this, the intensity of the fourth electric signal generated in the fourth pixel part also increases. Accordingly, according to this configuration, it is possible to appropriately realize the second pixel pair group of the position detection sensor.

In the position detection sensor, the first pixel part may include a plurality of first pixels arranged along the second direction, the second pixel part may include a plurality of second pixels arranged along the second direction, the third pixel part may include a plurality of third pixels arranged along the first direction, the fourth pixel part includes a plurality of fourth pixels arranged along the first direction. A width of the first pixels in the first direction may be smaller as the first pixels are closer to the first end in the second direction, a width of the second pixels in the first direction may be larger as the second pixels are closer to the first end in the second direction, a width of the third pixels in the second direction may be smaller as the third pixels are closer to the second end in the first direction, and a width of the fourth pixels in the second direction may be larger as the fourth pixels are closer to the second end in the first direction. When the first pixel pair group includes the first pixel part and the second pixel part, the following operation is obtained. Specifically, in the first pixel part, as the incident position is closer to the first end in the second direction, the incident light amount of the light that is incident to the first pixel part decreases, and according to this, the intensity of the first electric signal generated in the first pixel part also decreases. In contrast, in the second pixel part, as the incident position is closer to the first end in the second direction, the incident light amount of the light that is incident to the second pixel part increases, and according to this, the intensity of the second electric signal generated in the second pixel part also increases. Accordingly, according to this configuration, it is possible to appropriately realize the first pixel pair group of the position detection sensor. In addition, when the second pixel pair group includes the third pixel part and the fourth pixel part, the following operation is obtained. Specifically, in the third pixel part, as the incident position is closer to the second end in the first direction, the incident light amount of the light that is incident to the third pixel part decreases, and according to this, the intensity of the third electric signal generated in the third pixel part also decreases. In contrast, in the fourth pixel part, as the incident position is closer to the second end in the first direction, the incident light amount of the light that is incident to the fourth pixel part decreases, and according to this, the intensity of the fourth electric signal generated in the fourth pixel part also increases. Accordingly, according to this configuration, it is possible to appropriately realize the second pixel pair group of the position detection sensor.

In the position detection sensor, the first pixel part may include a plurality of first pixels arranged along the second direction, the second pixel part may include a plurality of second pixels arranged along the second direction, the third pixel part may include a plurality of third pixels arranged along the first direction, the fourth pixel part may include a plurality of fourth pixels arranged along the first direction, the first pixel part may include a plurality of first amplifiers which are electrically connected to the plurality of first pixels and amplify intensities of electric signals generated in the plurality of first pixels, the second pixel part may include a plurality of second amplifiers which are electrically connected to the plurality of second pixels, and amplify intensities of electric signals generated in the plurality of second pixels, the third pixel part may include a plurality of third amplifiers which are electrically connected to the plurality of third pixels, and amplify intensities of electric signals generated in the plurality of third pixels, and the fourth pixel part may include a plurality of fourth amplifiers which are electrically connected to the plurality of fourth pixels, and amplify intensities of electric signals generated in the plurality of fourth pixels. An amplification rate of the first amplifiers may be smaller as the first pixels electrically connected to the first amplifiers are closer to the first end in the second direction, an amplification rate of the second amplifiers may be larger as the second pixels electrically connected to the second amplifiers are closer to the first end in the second direction, an amplification rate of the third amplifiers may be smaller as the third pixels electrically connected to the third amplifiers are closer to the second end in the first direction, and an amplification rate of the fourth amplifiers may be larger as the fourth pixels electrically connected to the fourth amplifiers are closer to the second end in the first direction. When the first pixel pair group includes the first amplifiers and the second amplifiers, the following operation is obtained. Specifically, in the first pixel part, in the first pixel part, as the incident position is closer to the first end in the second direction, the intensity of the first electric signal output from the first pixel part decreases. In contrast, in the second pixel part, as the incident position is closer to the first end in the second direction, the intensity of the second electric signal output from the second pixel part increases. According to the configuration, it is possible to appropriately realize the first pixel pair group of the position detection sensor. In addition, when the second pixel pair group includes the third amplifiers and the fourth amplifiers, the following operation is obtained. Specifically, in the third pixel part, as the incident position is closer to the second end in the first direction, the intensity of the third electric signal output from the third pixel part is decreases. In contrast, in the fourth pixel part, as the incident position is closer to the second end in the first direction, the intensity of the fourth electric signal output from the fourth pixel part increases. Accordingly, according to the configuration, it is possible to appropriately realize the second pixel pair group of the position detection sensor.

According to another embodiment of the present disclosure, there is provided a position detection sensor that detects an incident position of light. The position detection sensor includes: a first pixel group that includes a plurality of first pixel parts which are arranged along a first direction and generate a first electric signal corresponding to an incident light amount of the light; a second pixel group that includes a plurality of second pixel parts which are arranged along a second direction intersecting the first direction and generate a second electric signal corresponding to an incident light amount of the light, the second pixel group intersecting the first pixel group; and a calculation unit that calculates a first position that is the incident position in the first direction and a second position that is the incident position in the second direction. In the first pixel part, as the incident position is closer to a first end of the first pixel group in the second direction, an intensity of the first electric signal decreases. In the second pixel part, as the incident position is closer to a second end of the second pixel group in the first direction, an intensity of the second electric signal decreases. The calculation unit calculates the first position on the basis of the integrated value of the intensity of the first electric signal and the second position on the basis of the integrated value of the intensity of the second electric signal. Even in this embodiment, the same effect as described above can be obtained.

Advantageous Effects of Invention

According to the present disclosure, even in a case where a spot diameter of incident light is small, it is possible to detect a two-dimensional position to which light incident with accuracy and at a high speed.

DESCRIPTION OF EMBODIMENTS

Figure 1:
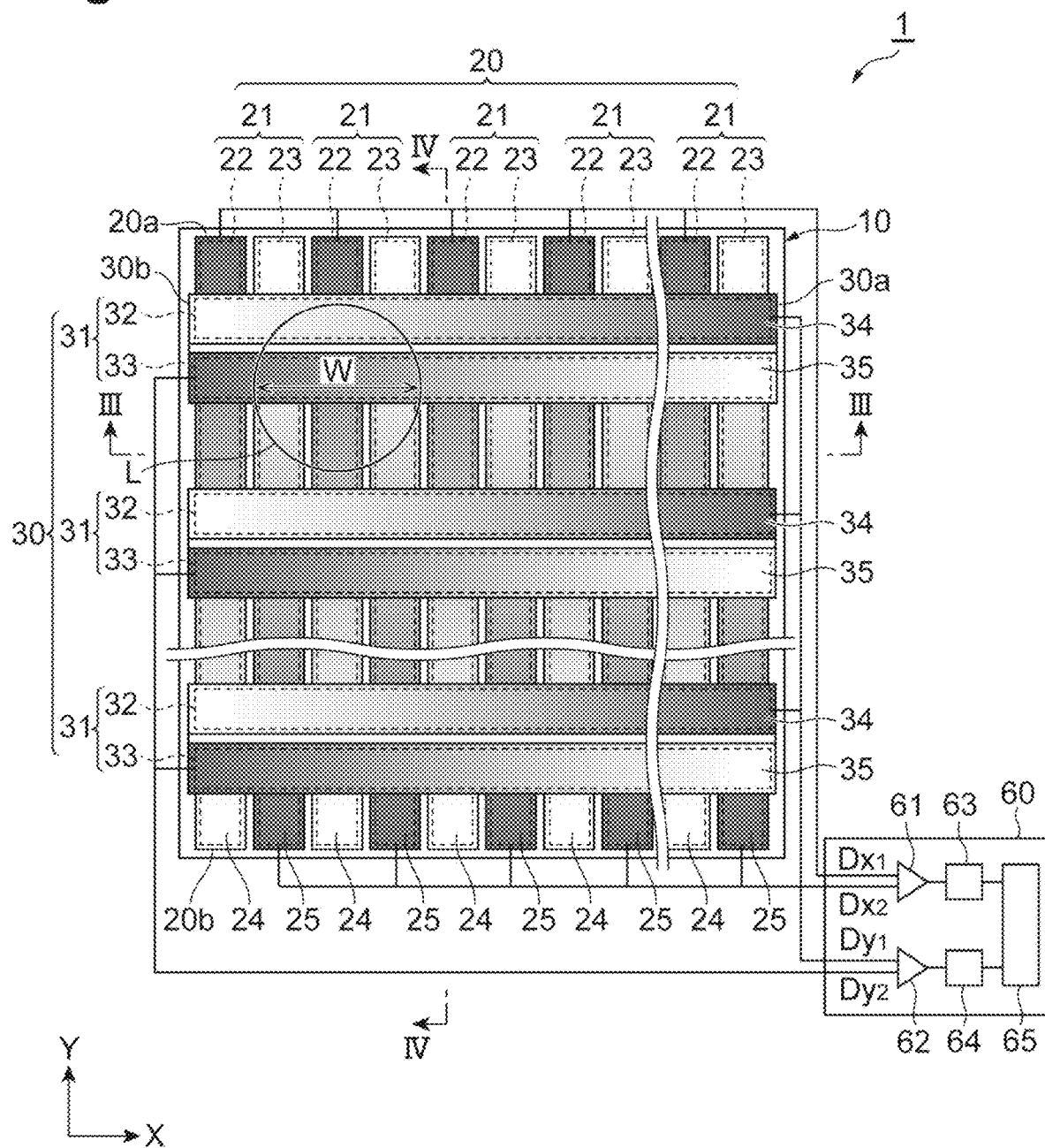
FIG. 1 is a schematic configuration diagram of a position detection sensor of an embodiment.

Hereinafter, an embodiment of a position detection sensor of the present disclosure will be described in detail with reference to the accompanying drawings. In description of the drawings, the same reference numeral will be given to the same element, and redundant description will be appropriately omitted.

Embodiment

FIG. 1 is a schematic configuration diagram illustrating a position detection sensor 1 of this embodiment. The position detection sensor 1 is a sensor that detects a two-dimensional position with respect to an incident position of a light spot L. Specifically, the position detection sensor 1 detects a first detection position (first position) that is an incident position of the light spot L in an X-axis direction (first direction), and a second detection position (second position) that is an incident position of the light spot L in a Y-axis direction (second direction) that interests the X-axis direction. A luminance distribution of the light spot L has a Gaussian distribution (that is, an intensity distribution that is the strongest in the vicinity of the center, and gradually weakens toward the periphery) expressed by the following Expression (1). In Expression (1), I represents the intensity of the light spot L, and r is a distance from the center of the light spot L. $\omega$ is the distance r when the intensity I becomes $1/e^2$, and is a radius of the light spot L having the Gaussian distribution. The diameter W of the light spot L is expressed by 2ω.

[Mathematical Formula 1]

$$I(r) = \exp\left(-2\frac{r^2}{\omega^2}\right) \quad (1)$$

As illustrated in FIG. 1, the position detection sensor 1 includes a light-receiving unit 10 and an operation processing unit 60. The light-receiving unit 10 includes a first pixel pair group 20 and a second pixel pair group 30. The first pixel pair group 20 includes a plurality of first pixel pairs 21 which are arranged along the X-axis direction in an XY plane. Each of the plurality of first pixel pairs 21 includes a first pixel part 22 and a second pixel part 23 which are arranged side by side in the X-axis direction. For example, the first pixel part 22 and the second pixel part 23 have a rectangular shape in which the Y-axis direction is set as a longitudinal direction, and are alternately aligned along the X-axis direction. When the light spot L is incident to the first pixel parts 22, the first pixel parts 22 generate first charge signals (first electric signals) corresponding to an incident light amount of the light spot L. Similarly, when the light spot L is incident to the second pixel parts 23, the second pixel parts 23 generate second charge signals (second electric signals) corresponding to an incident light amount of the light spot L.

The second pixel pair group 30 intersects the first pixel pair group 20 and is disposed on the first pixel pair group 20. The second pixel pair group 30 includes a plurality of second pixel pairs 31 which are arranged (for example, intermittently arranged) along the Y-axis direction in the XY plane. Each of the plurality of second pixel pairs 31 includes a third pixel part 32 and a fourth pixel part 33 which are arranged side by side in the Y-axis direction. For example, the third pixel part 32 and the fourth pixel part 33 have a rectangular shape in which the Y-axis direction is set as a longitudinal direction, and are alternately aligned along the Y-axis direction. When the light spot L is incident to the third pixel parts 32, the third pixel parts 32 generate second charge signals (third electric signals) corresponding to an incident light amount of the light spot L. Similarly, when the light spot L is incident to the fourth pixel parts 33, the fourth pixel parts 33 generate fourth charge signals (fourth electric signals) corresponding to an incident light amount of the light spot L. As a method of arranging the second pixel pair group 30 on the first pixel pair group 20, a method of laminating a substrate including the second pixel pair group 30 and a substrate including the first pixel pair group 20 is considered.

The first pixel pair group 20 further includes a plurality of first transmission filters 24 which are respectively arranged on the plurality of first pixel parts 22, and a plurality of second transmission filters 25 which are respectively arranged on the plurality of second pixel parts 23. The second pixel pair group 30 further includes a plurality of third transmission filters 34 which are respectively arranged on the plurality of third pixel parts 32, and a plurality of fourth transmission filters 35 which are respectively arranged on the plurality of fourth pixel parts 33. The first transmission filters 24, the second transmission filters 25, the third transmission filters 34, and the fourth transmission filters 35 allow incident light to be transmitted therethrough.

Figure 2:
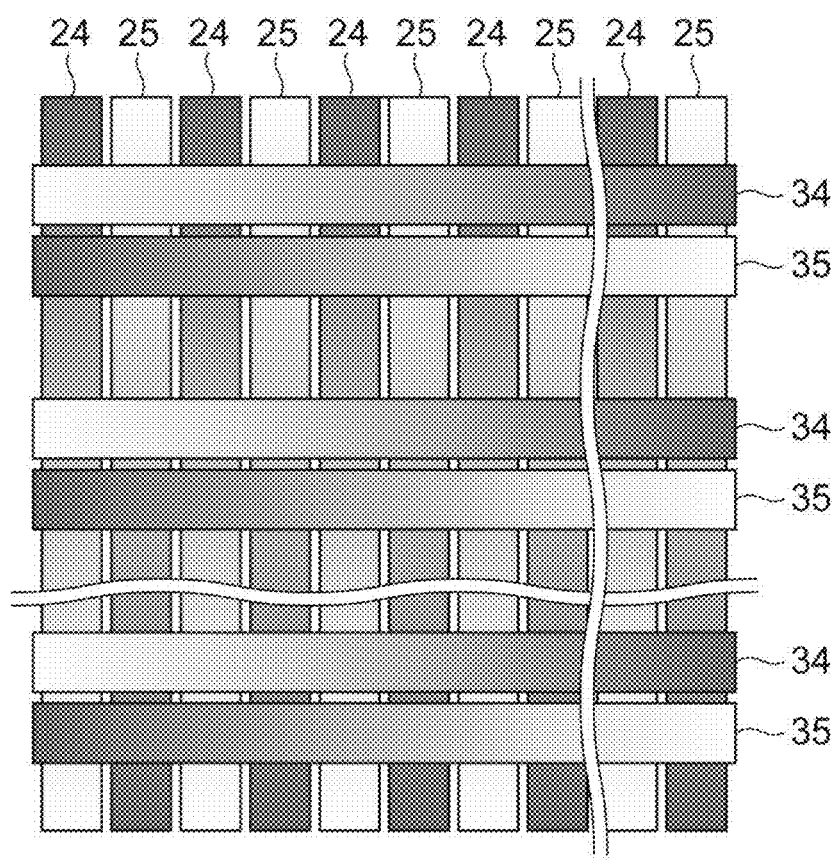
FIG. 2 is a top plan view illustrating a plurality of first transmission filters, a plurality of second transmission filters, a plurality of third transmission filters, and a plurality of fourth transmission filters.
Figure 2:
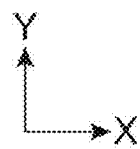

FIG. 2 is a top view illustrating the first transmission filters 24, the second transmission filters 25, the third transmission filters 34, and the fourth transmission filters 35. As illustrated in FIG. 2, for example, the first transmission filters 24 and the second transmission filters 25 have a rectangular shape in which the Y-axis direction is set as a longitudinal direction, and are alternately arranged along the X-axis direction. For example, the third transmission filter 34 and the fourth transmission filters 35 have a rectangular shape in which the X-axis direction is set as a longitudinal direction, and are alternately arranged along the Y-axis direction. In FIG. 1 and FIG. 2, a transmittance of the first transmission filter 24, the second transmission filter 25, the third transmission filter 34, and the fourth transmission filter 35 is expressed in shades of color. The smaller the transmittance is, the shades are darker, and the larger the transmittance is, the shades are thinner.

Figure 3:
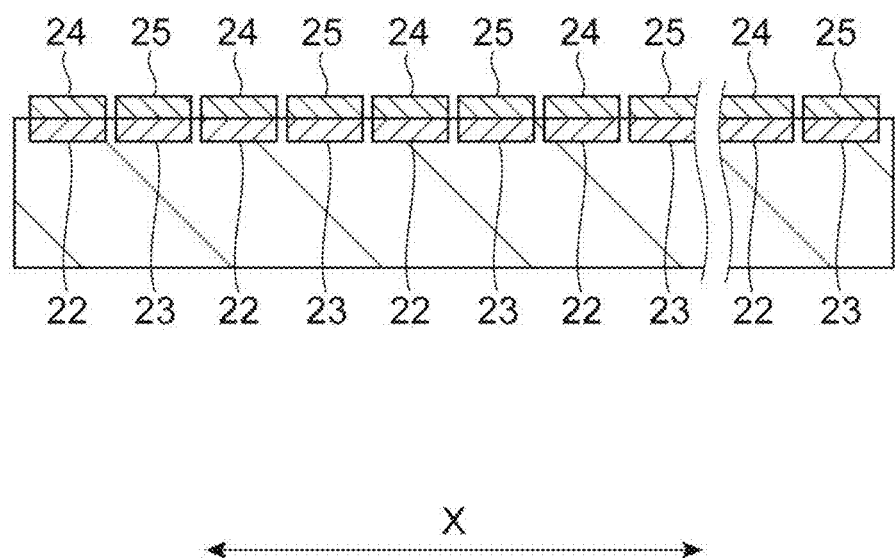
FIG. 3 is a cross-sectional view taken along line III-III in FIG. 1.
Figure 4:
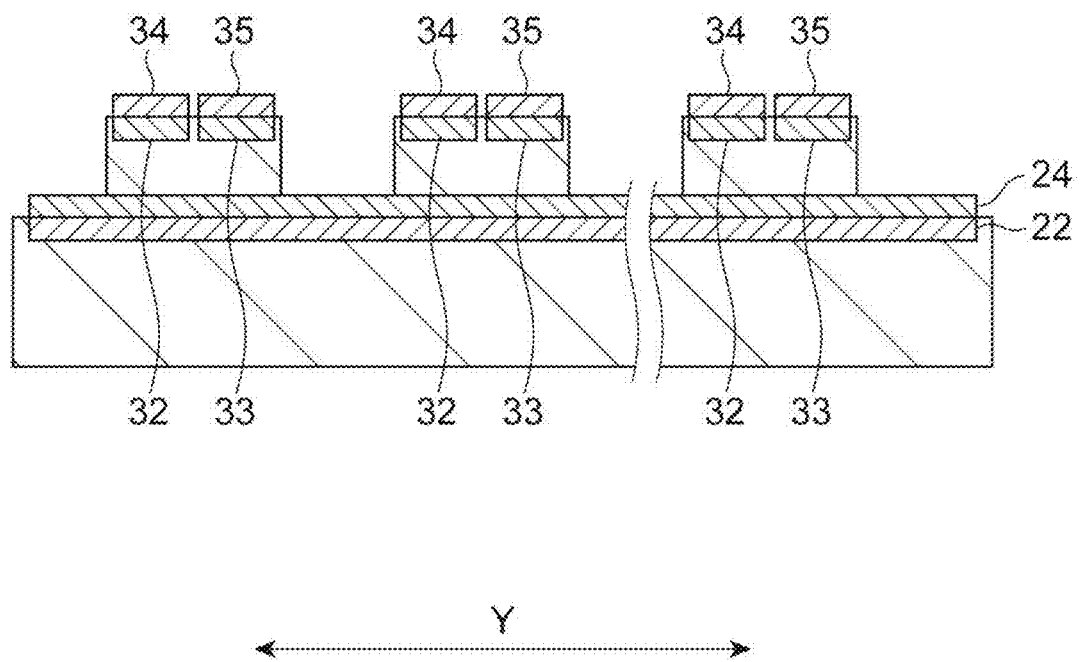
FIG. 4 is a cross-sectional view taken along line IV-IV in FIG. 1.

FIG. 3 is a cross-sectional view taken along line illustrated in FIG. 1. As illustrated in FIG. 3, the first transmission filters 24 respectively cover the first pixel parts 22, and the second transmission filters 25 respectively cover the second pixel parts 23. FIG. 4 is a cross-sectional view taken along line IV-IV illustrated in FIG. 1. As illustrated in FIG. 4, the third transmission filters 34 respectively cover the third pixel parts 32, and the fourth transmission filters 35 respectively cover the fourth pixel parts 33. FIG. 1 will be referred to again. The transmittance of the first transmission filters 24 gradually decreases (that is, decreases in a monotone manner) as it is closer to one end 20a (first end) of the first pixel pair group 20 in the Y-axis direction, and gradually increases (that is, increases in a monotone manner) as it is closer to the other end 20b of the first pixel pair group 20 in the Y-axis direction on the first pixel parts 22. The transmittance of the first transmission filters 24 may gradually decrease as it is closer to the one end 20a in the Y-axis direction, or may gradually increase as it is closer to the other end 20b in the Y-axis direction on the first pixel parts 22.

When light is transmitted through the first transmission filters 24, an incident light amount of the light spot L that is incident to the first pixel parts 22 gradually decreases (or decreases step by step) as an incident position of the light spot L is closer to the one end 20a in the Y-axis direction, and gradually increases (or increases step by step) as the incident position is closer to the other end 20b in the Y-axis direction. According to this, the intensity of the first charge signals respectively generated in the first pixel parts 22 also gradually decreases (or decreases step by step) as the incident position is closer to the one end 20a in the Y-axis direction, and gradually increases (increases step by step) as the incident position is closer to the other end 20b in the Y-axis direction.

In contrast, the transmittance in the second transmission filters 25 gradually increases (or increases step by step) as it is closer to the one end 20a in the Y-axis direction, and gradually decreases (or decreases step by step) as the it is closer to the other end 20b in the Y-axis direction on the second pixel parts 23. When light is transmitted through the second transmission filters 25, an incident light amount of the light spot L that is incident to the second pixel parts 23 gradually increases (or increases step by step) as an incident position of the light spot L is closer to the one end 20a in the Y-axis direction, and gradually decreases (or decreases step by step) as the incident position is closer to the other end 20b in the Y-axis direction. According to this, the intensity of the second charge signals respectively generated in the second pixel parts 23 also gradually increases (or increases step by step) as the incident position is closer to the one end 20a in the Y-axis direction, and gradually decreases (decreases step by step) as the incident position is closer to the other end 20b in the Y-axis direction. In this manner, an increase direction or a decrease direction of the transmittance in the Y-axis direction is reversed between the first transmission filters 24 and the second transmission filters 25.

A transmittance of the third transmission filters 34 gradually decreases (or decreases step by step) as it is closer to one end 30a (second end) of the second pixel pair group 30 in the X-axis direction, and gradually increases (or increases step by step) as it is closer to the other end 30b of the second pixel pair group 30 in the X-axis direction on the third pixel parts 32. When light is transmitted through the third transmission filters 34, an incident light amount of the light spot L that is incident to the third pixel parts 32 gradually decreases (or decreases step by step) as an incident position of the light spot L is closer to the one end 30a in the X-axis direction, and gradually increases (or increases step by step) as the incident position of the light spot L is closer to the other end 30b in the X-axis direction. According to this, the intensity of the third charge signals generated in the third pixel parts 32 also gradually decreases (or decreases step by step) as the incident position is closer to the one end 30a in the X-axis direction, and gradually increases (or increases step by step) as the incident position is closer to the other end 30b in the X-axis direction.

In contrast, a transmittance of the fourth transmission filters 35 gradually increases (or increases step by step) as it is closer to the one end 30a in the X-axis direction, and gradually decreases (or decreases step by step) as it is closer to the other end 30b in the X-axis direction on the fourth pixel parts 33. When light is transmitted through the fourth transmission filters 35, an incident light amount of the light spot L that is incident to the fourth pixel parts 33 gradually increases (or increases step by step) as the incident position of the light spot L is closer to the one end 30a in the X-axis direction, and gradually decreases (or decreases step by step) as the incident position of the light spot L is closer to the other end 30b in the X-axis direction. According to this, the intensity of the fourth charge signals generated in the fourth pixel parts 33 also gradually increases (or increases step by step) as the incident position is closer to the one end 30a in the X-axis direction, and gradually decreases (or decreases step by step) as the incident position is closer to the other end 30b in the X-axis direction. In this manner, an increase direction or a decrease direction of the transmittance in the X-axis direction is reversed between the third transmission filters 34 and the fourth transmission filters 35.

The operation processing unit 60 includes amplifiers 61 and 62, A/D converters 63 and 64, and a calculation unit 65. The amplifier 61 is electrically connected to the first pixel parts 22 and the second pixel parts 23. An integrated value Dx1 of intensities of the first charge signals output from the plurality of first pixel parts 22, and an integrated value Dx2 of intensities of the second charge signals output from the plurality of second pixel parts 23 are input to the amplifier 61. The integrated value Dx1 of the intensities of the first charge signals and the integrated value Dx2 of the intensities of the second charge signals are converted into differential voltage signals by the amplifier 61. The A/D converter 63 is electrically connected to an output terminal of the amplifier 61. The A/D converter 63 converts a voltage value output from the output terminal of the amplifier 61 into a digital value, and output the digital value. The digital value is a value corresponding to a difference between the integrated value Dx1 of the first charge signals and the integrated value Dx2 of the second charge signals.

On the other hand, the amplifier 62 is electrically connected to the third pixel parts 32 and the fourth pixel parts 33. An integrated value Dy1 of intensities of the third charge signals output from the plurality of third pixel parts 32, and an integrated value Dy2 of intensities of the fourth charge signals output from the plurality of fourth pixel parts 33 are input to the amplifier 62. The integrated value Dy1 of the intensities of the third charge signals and the integrated value Dy2 of the intensities of the fourth charge signals are converted into differential voltage signals by the amplifier 62. The A/D converter 64 is electrically connected to an output terminal of the amplifier 62. The A/D converter 64 converts a voltage value output from the output terminal of the amplifier 62 into a digital value, and output the digital value. The digital value is a value corresponding to a difference between the integrated value Dy1 of the third charge signals and the integrated value Dy2 of the fourth charge signals.

The calculation unit 65 is electrically connected to the A/D converters 63 and 64. The calculation unit 65 calculates a first detection position that is an incident position of the light spot L in the X-axis direction and a second detection position that is an incident position of the light spot L in the Y-axis direction on the basis of the digital signals output from the A/D converters 63 and 64, that is, on the basis of the integrated values Dx1, Dx2, Dy1, and Dy2. As described above, the intensities of the first charge signals generated in the first pixel parts 22 decrease as the incident position of the light spot L is closer to the one end 20a in the Y-axis direction, and the intensities of the second charge signals generated in the second pixel parts 23 increases as the incident position of the light spot L is closer to the one end 20a in the Y-axis direction. The calculation unit 65 calculates the second detection position on the basis of the integrated value Dx1 of the intensities of the first charge signals and the integrated value Dx2 of the intensities of the second charge signals by using a variation of the intensities of the respective charge signals. For example, the calculation unit 65 calculates the second detection position by calculating a ratio between a difference of the integrated value Dx1 and the integrated value Dx2, and a total value of the integrated value Dx1 and the integrated value Dx2. Specifically, the calculation unit 65 calculates a ratio Ry by using the following Expression (2), and calculates the second detection position on the basis of the ratio Ry. In this embodiment, the total value of the integrated value Dx1 and the integrated value Dx2 is determined in advance on the basis of a known light amount of the light spot L.

[Mathematical Formula 2]

$$Ry = \frac{Dx1 - Dx2}{Dx1 + Dx2} \tag{2}$$

On the other hand, as described above, the intensities of the third charge signals generated in the third pixel parts 32 decrease as the incident position of the light spot L is closer to the one end 30a in the X-axis direction, and the intensities of the fourth charge signals generated in the fourth pixel part 33 increase as the incident position of the light spot L is closer to the one end 30a in the Y-axis direction. The calculation unit 65 calculates the first detection position on the basis of a ratio between the integrated value Dy1 of the intensities of the third charge signals and the integrated value Dy2 of the intensities of the fourth charge signals by using the variation in the intensities of the respective charge signals with respect to the incident position of the light spot L in the X-axis direction. For example, the calculation unit 65 calculates the first direction position by calculating a ratio between a difference of the integrated value Dy1 and the integrated value Dy2 and a total value of the integrated value Dy1 and the integrated value Dy2. Specifically, the calculation unit 65 calculates a ratio Rx by using the following Expression (3) and calculates the first detection position on the basis of the ratio Rx. In this embodiment, the total value of the integrated value Dy1 and the integrated value Dy2 is determined in advance on the basis of a known light amount of the light spot L.

[Mathematical Formula 3]

$$Rx = \frac{Dy1 - Dy2}{Dy1 + Dy2} \quad (3)$$

Individual amplifiers may be electrically connected to the first pixel part 22, the second pixel part 23, the third pixel part 32, and the fourth pixel part 33. In this case, a voltage value corresponding to the integrated value Dx1 of the intensities of the first charge signals, a voltage value corresponding to the integrated value Dx2 of the intensities of the second charge signals, a voltage value corresponding to the integrated value Dy1 of the intensities of the third charge signals, and a voltage value corresponding to the integrated value Dy2 of the intensities of the fourth charge signals are respectively output from the amplifiers. The calculation unit 65 calculates the first detection position and the second detection position as described above on the basis of the voltage values (that is, the integrated values Dx1, Dx2, Dy1, and Dy2).

Figure 18:
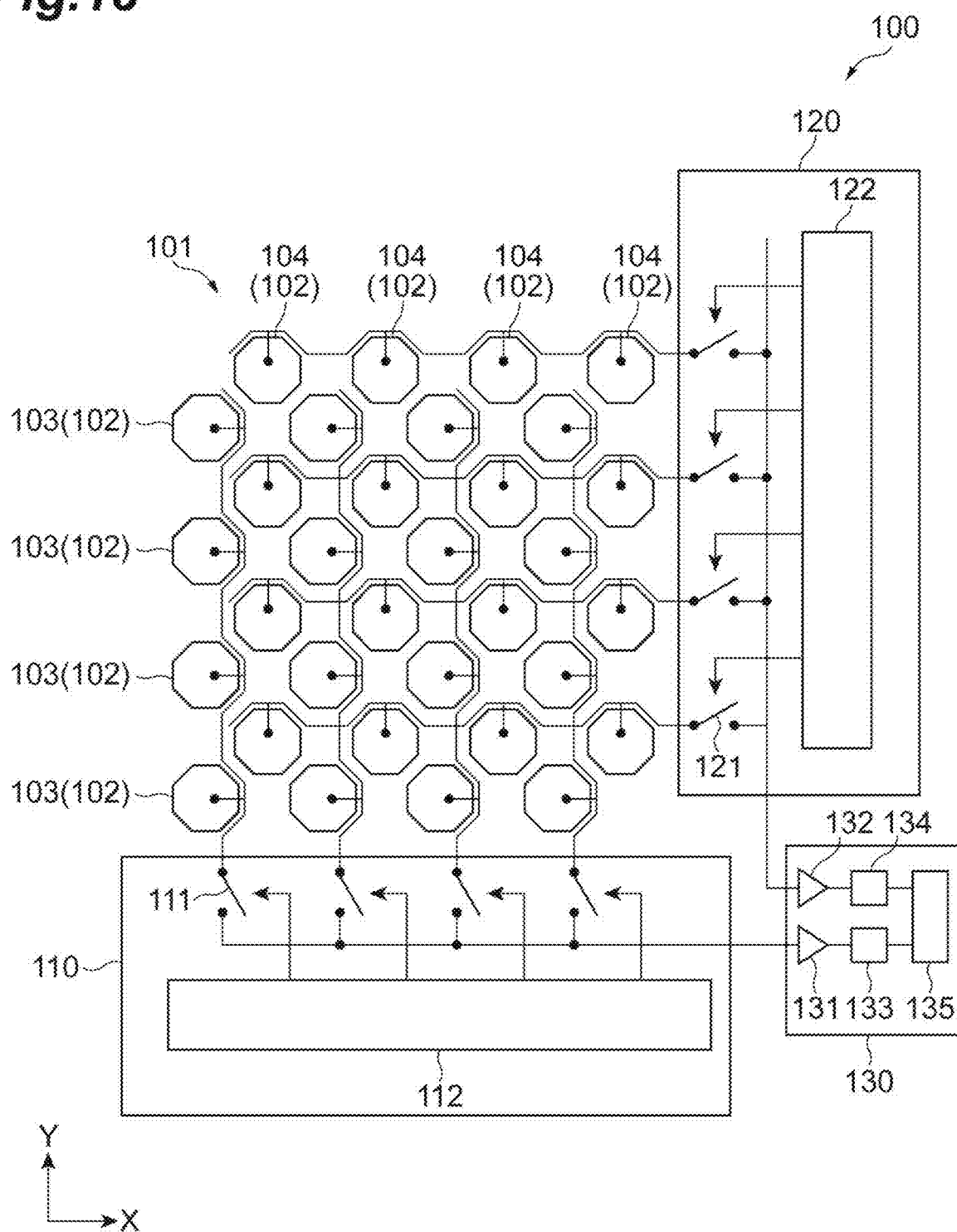
FIG. 18 is a schematic configuration diagram illustrating a profile sensor as a comparative example.

An effect obtained by the above-described position detection sensor 1 of this embodiment will be described together with a problem in a comparative example. For example, in a field of robot control or optical control, a profile sensor specialized for detecting a position of an incident light spot is suggested. For example, the profile sensor is applied to MEMS control application or the like. FIG. 18 is a view illustrating a profile sensor 100 as a comparative example. As illustrated in FIG. 18, the profile sensor 100 includes a light-receiving unit 101, a first signal processing unit 110, a second signal processing unit 120, and an operation processing unit 130. The light-receiving unit 101 includes a plurality of pixels 102 which are two-dimensionally arranged. Each of the pixels 102 is divided into two regions. A Y-axis direction pixel 103 and an X-axis direction pixel 104 are provided in the two regions of the pixel part 102, respectively. A plurality of the Y-axis direction pixels 103 are wired to each other for every column (that is, in the Y-axis direction), and a plurality of the X-axis direction pixels 104 are wired to each other for every row (that is, in the X-axis direction).

The first signal processing unit 110 includes a plurality of switch elements 111 and a shift register 112. Input terminals of the switch elements 111 are electrically connected to the Y-axis direction pixels 103. The shift register 112 is provided to sequentially read out charge signals from the Y-axis direction pixels 103. The shift register 112 outputs a control signal for controlling an operation of the switch elements 111. The switch elements 111 are sequentially closed by the control signal output from the shift register 112. When the switch elements 111 are sequentially closed, the charge signals generated in the Y-axis direction pixels 103 are sequentially output from output terminals of the switch elements 111. An amplifier 131 outputs voltage values corresponding to charge signals output from the output terminals of the switch elements 111. The voltage values are converted into digital values by an A/D converter 133, and are sequentially input to a calculation unit 135 as time-series data. The time-series data represents a projection image (profile) in the X-axis direction. The calculation unit 135 calculates a position in the X-axis direction with respect to an incident position of a light spot by the projection image in the X-axis direction.

The second signal processing unit 120 includes a plurality of switch elements 121 and a shift register 122. Input terminals of the switch elements 121 are electrically connected to the X-axis direction pixels 104. The shift register 122 is provided to sequentially read out charge signals from the X-axis direction pixels 104. The shift register 122 outputs a control signal for controlling an operation of the switch elements 121. The switch elements 121 are sequentially closed by the control signal that is output from the shift register 122. When the switch elements 121 are sequentially closed, the charge signals generated in the X-axis direction pixels 104 are sequentially output from output terminals of the switch elements 121. An amplifier 132 output voltage values corresponding to the charge signals output from the output terminals of the switch elements 121. The voltage values are converted into digital values by an A/D converter 134, and are sequentially input to the calculation unit 135 as time-series data. The time-series data represents a projection image in the Y-axis direction. The calculation unit 135 calculates a position in the Y-axis direction with respect to an incident position of a light spot by the projection image in the Y-axis direction.

However, in the profile sensor 100, many charge signals are read out to obtain the projection image in the X-axis direction and the projection image in the Y-axis direction, and thus there is a tendency that time is further taken in reading-out of the charge signals in comparison to the four-division photodiode in which only four charge signals are read out. Accordingly, in the profile sensor 100, it is difficult to detect the two-dimensional position to which the light spot is incident at a higher speed in comparison to the four-division photodiode.

On the other hand, in the four-division photodiode, four charge signals are read out from four pixels which are arranged in a first quadrant to a fourth quadrant centering around the origin, and the two-dimensional position to which the light spot is incident is detected by taking a ratio of the charge signals. In the four-division photodiode, the number of charge signals which are read out is smaller in comparison to the profile sensor, and thus it is possible to further suppress time necessary for reading-out of the charge signals. According to this, it is possible to detect the two-dimensional position to which the light spot is incident at a high speed. However, in the four-division photodiode, it is necessary to use the ratio of the four electric signals which are respectively output from the four pixels so as to calculate the two-dimensional position. Accordingly, in the four-division photodiode, the number of pixels is limited to four, and it is necessary for the light spot to be incident to all of the four pixels. In a case where the size of a spot diameter of light that is incident to the four-division photodiode is small, the light may not be incident to any one of the four pixels. Accordingly, there is a concern that it is difficult to calculate the two-dimensional position by using the ratio of the charge signals. In addition, in a case where the light spot is incident to a position that is distant from the center of the four-division photodiode, linearity of an intensity difference between the electric signals deteriorates, and thus it is difficult to detect the two-dimensional position with accuracy.

In the position detection sensor 1 of this embodiment, the calculation unit 65 calculates the second detection position on the basis of the integrated value Dx1 of the intensities of the first charge signals and the integrated value Dx2 of the intensities of the second charge signals by using a variation of the intensities of the first charge signals and the second charge signals with respect to the incident position of the light spot L in the Y-axis direction. In addition, the calculation unit 65 calculates the first detection position on the basis of the integrated value Dy1 of the intensities of the third charge signals and the integrated value Dy2 of the intensities of the fourth charge signals by using a variation of the intensities of the third charge signals and the fourth charge signals with respect to the incident position of the light spot L in the X-axis direction. As described above, the calculation unit 65 collectively reads out the charge signals instead of reading out the intensities of the charge signals for every pixel part (that is, the first pixel part 22, the second pixel part 23, the third pixel part 32, and the fourth pixel part 33), and calculates the first detection position and the second detection position on the basis of an integrated value of the intensities of the charge signals. Accordingly, in the position detection sensor 1, it is possible to further suppress time necessary for reading-out of the charge signal in comparison to the profile sensor 100. According to this, the position detection sensor 1 can detect the first detection position and the second detection position at a higher speed in comparison to the profile sensor 100. In addition, in the position detection sensor 1, it is possible to dispose a large number of pixel parts in comparison to the four-division photodiode. Accordingly, even in a case where a diameter W of the light spot L is small, it is possible to calculate a two-dimensional position to which the light spot L is incident on the basis of the output electric signals by adjusting the size and arrangement of the pixel parts. In addition, it is possible to suppress occurrence of a problem in which the intensity of the electric signal that is incident to each pixel part is greatly biased in accordance with the incident position of the light spot L through the adjustment. As a result, it is possible to detect the first detection position and the second detection position with accuracy regardless of the incident position of the light spot L.

First Modification Example

Figure 5:
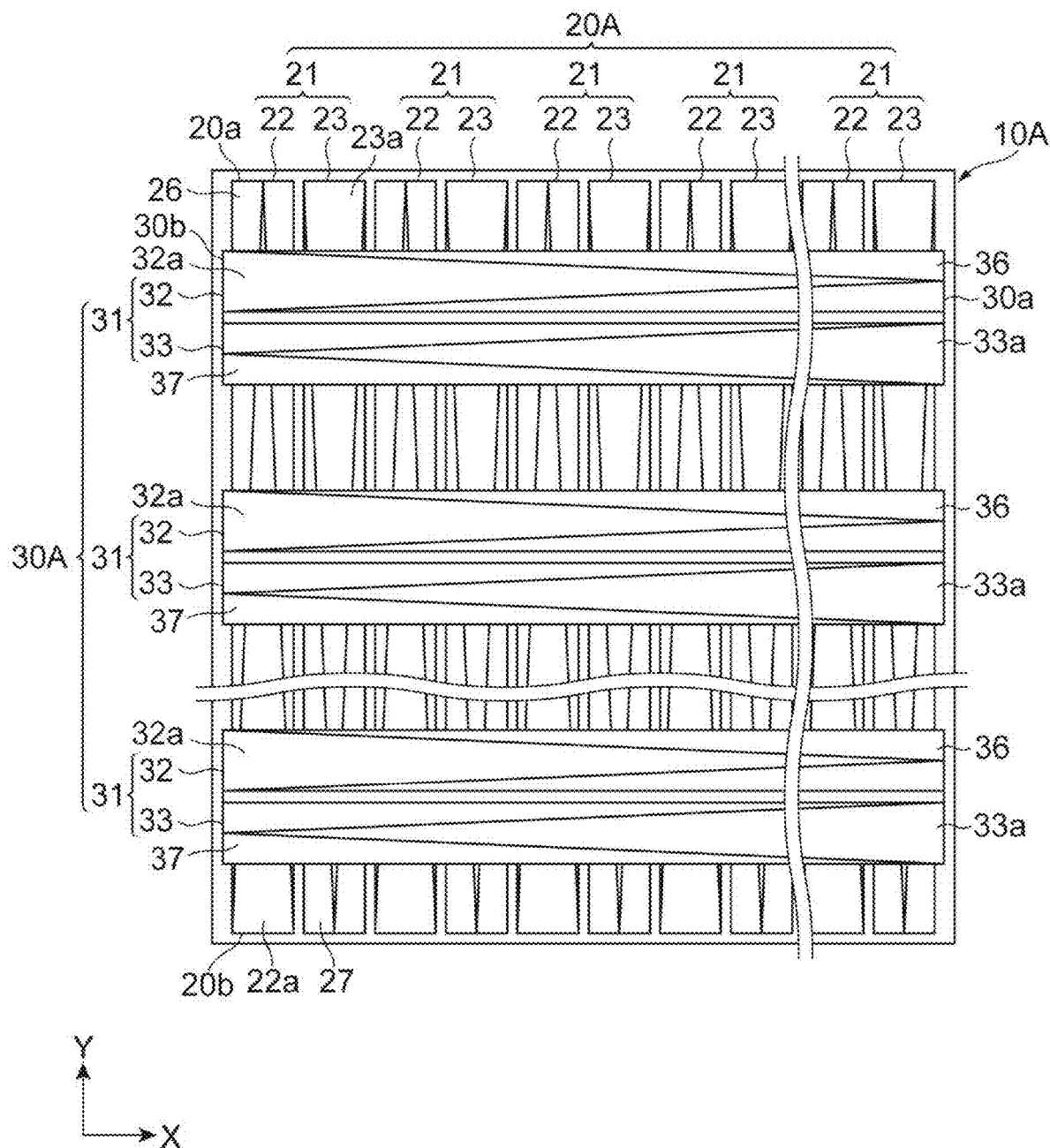
FIG. 5 is a schematic configuration diagram illustrating a light-receiving unit according to a first modification example.

FIG. 5 is a schematic configuration diagram illustrating a light-receiving unit 10A according to a first modification example. A difference between this modification example and the embodiment is in that a first pixel pair group 20A of the light-receiving unit 10A according to this modification example includes a plurality of first light-shielding parts 26 and a plurality of second light-shielding parts 27 instead of the plurality of first transmission filters 24 and the plurality of second transmission filters 25, and a second pixel pair group 30A of the light-receiving unit 10A includes a plurality of third light-shielding parts 36 and a plurality of fourth light-shielding parts 37 instead of the plurality of third transmission filters 34 and the plurality of fourth transmission filters 35.

Each of the first light-shielding parts 26 is disposed on each of the first pixel parts 22, and shields incident light. The first light-shielding part 26 covers another portion of the first pixel part 22 excluding one portion 22a thereof. A width of the one portion 22a in the X-axis direction gradually decreases (or decreases step by step) as it is closer to the one end 20a of the first pixel pair group 20A in the Y-axis direction, and gradually increases (or increases step by step) as it is closer to the other end 20b of the first pixel pair group 20A. In an example, the one portion 22a has an isosceles triangular shape that tapers toward the one end 20a side in the Y-axis direction. In this case, the first light-shielding part 26 has a shape that is hollowed out in the isosceles triangular shape.

On the other hand, each of the second light-shielding parts 27 is disposed on each of the second pixel parts 23, and shields incident light. The second light-shielding part 27 covers another portion of each of the plurality of second pixel parts 23 excluding one portion 23a thereof. A width of the one portion 23a in the X-axis direction gradually increases (or increases step by step) as it is closer to the one end 20a in the Y-axis direction, and gradually decreases (or decreases step by step) as it is closer to the other end 20b in the Y-axis direction. In an example, the one portion 23a of each of the plurality of second pixel parts 23 has an isosceles triangular shape that tapers toward the other end 20b side in the Y-axis direction. In this case, the second light-shielding part 27 has a shape that is hollowed out in the isosceles triangular shape.

When the first pixel pair group 20A includes the first light-shielding part 26 and the second light-shielding part 27, the following operation is obtained. Specifically, in the first pixel parts 22, as the incident position of the light spot L is closer to the one end 20a in the Y-axis direction, an incident light amount of the light spot L incident to the first pixel parts 22 decreases, and according to this, the intensities of the first charge signals generated in the first pixel parts 22 also decrease. In contrast, in the second pixel parts 23, as the incident position of the light spot L is closer to the one end 20a in the Y-axis direction, an incident light amount of the light spot L incident to the second pixel parts 23 increases, and according to this, the intensities of the second charge signals generated in the second pixel parts 23 also increase.

Each of the third light-shielding parts 36 disposed on each of the third pixel parts 32 and shields incident light. The third light-shielding part 36 covers another portion of the third pixel part 32 excluding one portion 32a thereof. In the one portion 32a, a width in the Y-axis direction gradually decreases (or decreases step by step) as it is closer to the one end 30a of the second pixel pair group 30A in the X-axis direction, and gradually increases (or increases step by step) as it is closer to the other end 30b of the second pixel pair group 30A. In an example, the one portion 32a has an isosceles triangular shape that tapers toward the one end 30a side in the X-axis direction. In this case, the third light-shielding part 36 has a shape that is hollowed out in the isosceles triangular shape.

On the other hand, each of the fourth light-shielding parts 37 is disposed on each of the fourth pixel parts 33, and shields incident light. The fourth light-shielding part 37 covers another portion of each of the plurality of fourth pixel parts 33 excluding one portion 33a thereof. A width of the one portion 33a in the Y-axis direction gradually increases (or increases step by step) as it is closer to the one end 30a in the X-axis direction, and gradually decreases (or decreases step by step) as it is closer to the other end 30b in the X-axis direction. In an example, the one portion 33a has an isosceles triangular shape that tapers toward the other end 30b side in the X-axis direction. In this case, the fourth light-shielding part 37 has a shape that is hollowed out in the isosceles triangular shape.

When the second pixel pair group 30A includes the third light-shielding part 36 and the fourth light-shielding part 37, the following operation is obtained. Specifically, in the third pixel parts 32, as the incident position of the light spot L is closer to the one end 30a in the X-axis direction, an incident light amount of the light spot L incident to the third pixel parts 32 decreases, and according to this, the intensities of the third charge signals generated in the third pixel parts 32 also decrease. In contrast, in the fourth pixel parts 33, as the incident position of the light spot L is closer to the one end 30a in the X-axis direction, an incident light amount of the light spot L incident to the fourth pixel parts 33 increases, and according to this, the intensities of the fourth charge signals generated in the fourth pixel parts 33 also increase.

Second Modification Example

Figure 6:
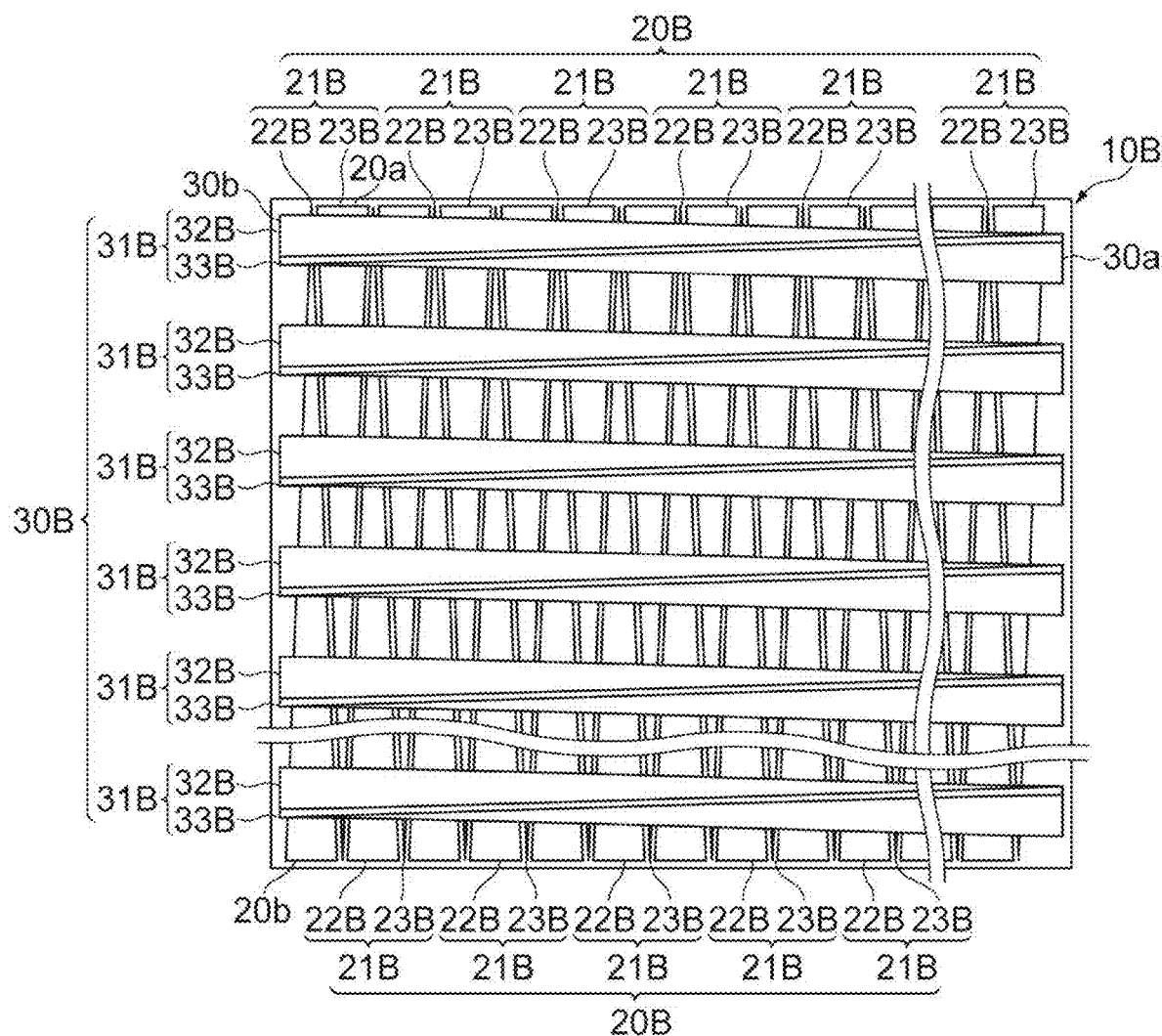
FIG. 6 is a schematic configuration diagram illustrating a light-receiving unit according to a second modification example.

FIG. 6 is a schematic configuration diagram illustrating a light-receiving unit 10B according to a second modification example. A difference between this modification example and the embodiment is in that a first pixel pair group 20B of the light-receiving unit 10B according to this modification example does not include the plurality of first transmission filters 24 and the plurality of second transmission filters 25, a second pixel pair group 30B of the light-receiving unit 10B does not include the plurality of third transmission filters 34 and the plurality of fourth transmission filters 35, and shapes of the pixel parts of the first pixel pair group and the second pixel pair group are different. A width of each first pixel part 22B of first pixel pairs 21B of the first pixel pair group 20B in the X-axis direction gradually increases as it is closer to the one end 20a of the first pixel pair group 20B in the Y-axis direction, and gradually decreases as it is closer to the other end 20b of the first pixel pair group 20B. In an example, the first pixel part 22B has an isosceles triangular shape that tapers toward the one end 20a side in the Y-axis direction. In contrast, a width of each second pixel part 23B in the X-axis direction gradually increases as it is closer to the one end 20a in the Y-axis direction, and gradually decreases as it is closer to the other end 20b in the Y-axis direction. In an example, the second pixel part 23B has an isosceles triangular shape that tapers toward the other end 20b side in the Y-axis direction.

When the first pixel pair group 20B includes the first pixel parts 22B and the second pixel parts 23B, the following operation is obtained. Specifically, in the first pixel parts 22B, as the incident position of the light spot L is closer to the one end 20a in the Y-axis direction, an incident light amount of the light spot L incident to the first pixel parts 22B decreases, and according to this, the intensities of the first charge signals generated in the first pixel parts 22B also decrease. In contrast, in the second pixel parts 23B, as the incident position of the light spot L is closer to the one end 20a in the Y-axis direction, an incident light amount of the light spot L incident to the second pixel parts 23B increases, and according to this, the intensities of the second charge signals generated in the second pixel parts 23B also increase.

In each third pixel part 32B of second pixel pairs 31B of the second pixel pair group 30B, a width in the Y-axis direction gradually increases as it is closer to the one end 30a of the second pixel pair group 30B in the X-axis direction, and gradually decreases as it is closer to the other end 30b of the second pixel pair group 30B. In an example, the third pixel parts 32B has an isosceles triangular shape that tapers toward the one end 30a side in the X-axis direction. In contrast, a width of each fourth pixel part 33B in the Y-axis direction gradually increases as it is closer to the one end 30a in the X-axis direction, and gradually decrease as it is closer to the other end 30b in the X-axis direction. In an example, the fourth pixel part 33B has an isosceles triangular shape that tapers toward the other end 30b side in the X-axis direction.

When the second pixel pair group 30B includes the third pixel parts 32B and the fourth pixel parts 33B, the following operation is obtained. Specifically, in the third pixel parts 32B, as the incident position of the light spot L is closer to the one end 30a in the X-axis direction, an incident light amount of the light spot L incident to the third pixel parts 32B decreases, and according to this, the intensities of the third charge signals generated in the third pixel parts 32B also decrease. In contrast, in the fourth pixel parts 33B, as the incident position of the light spot L is closer to the one end 30a in the X-axis direction, an incident light amount of the light spot L incident to the fourth pixel parts 33B increases, and according to this, the intensities of the fourth charge signals generated in the fourth pixel parts 33B also increase.

Figure 7:
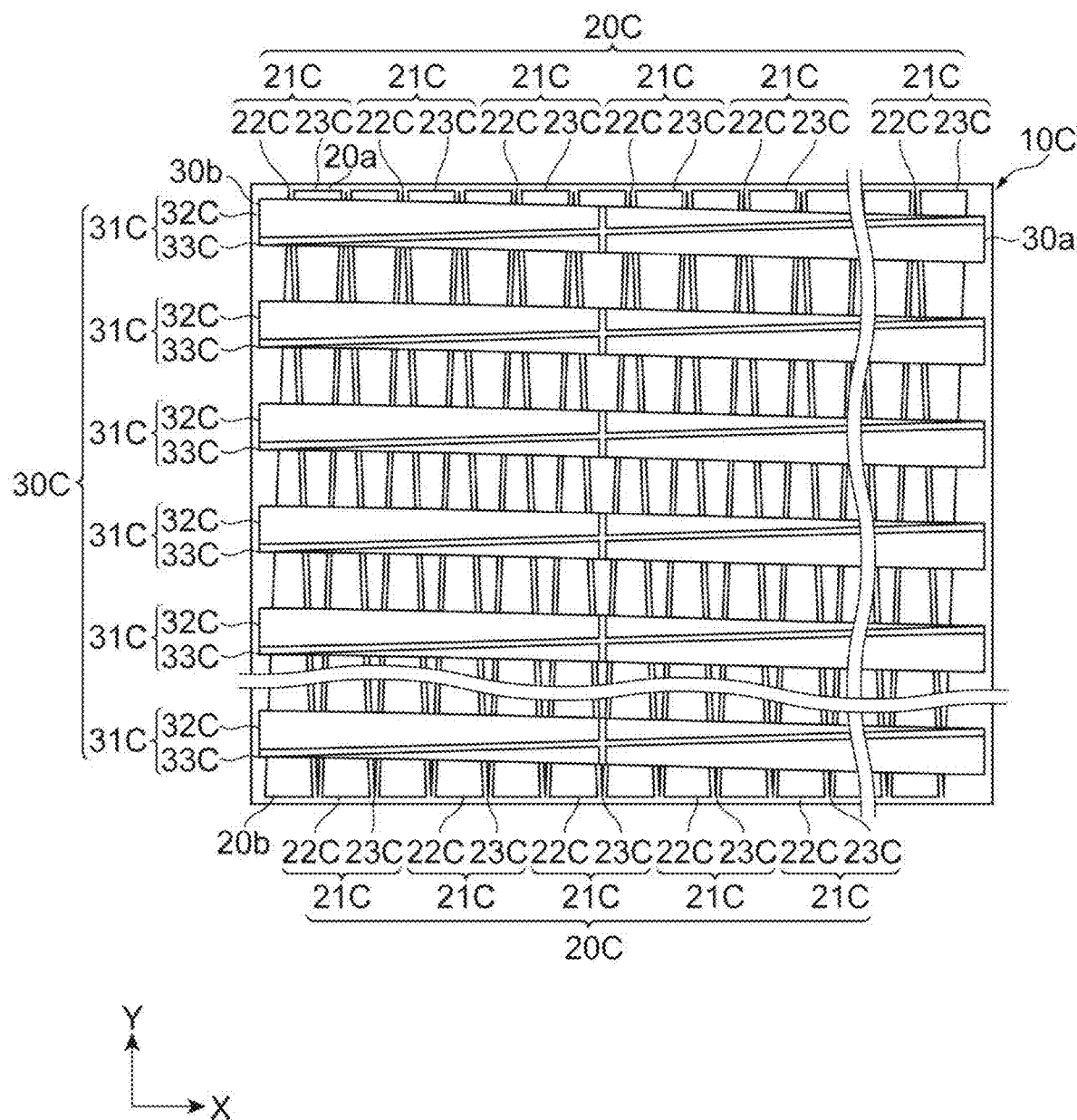
FIG. 7 is a schematic configuration diagram illustrating a light-receiving unit according to another example of the second modification example.

FIG. 7 is a schematic configuration diagram illustrating a light-receiving unit 10C according to another example of this modification example. As illustrated in FIG. 7, first pixel parts 22C and second pixel parts 23C of first pixel pairs 21C of a first pixel pair group 20C are divided into two parts at a boundary near the center in the Y-axis direction, and third pixel parts 32C and fourth pixel parts 33C of second pixel pairs 31C of a second pixel pair group 30C are divided into two parts at a boundary near the center in the X-axis direction. In this case, charge signals are output from both ends of the first pixel parts 22C in the Y-axis direction, and charge signals are output from both ends of the second pixel parts 23C in the Y-axis direction. These charge signals are input to the amplifier 61 (refer to FIG. 1). On the other hand, charge signals are output from both ends of the third pixel parts 32C in the X-axis direction, and charge signals are output from both ends of the fourth pixel parts 33C in the X-axis direction. These charge signals are input to the amplifier 62 (refer to FIG. 1). Here, for example, the longer a movement distance of the charge signals generated from the first pixel part 22C in the first pixel parts 22C is, the further time is taken in reading-out of the charge signals. The reason for this is considered as follows. Since a movement speed of the charge signals in a diffusion layer that constitutes the first pixel parts 22C is slow, time is also taken for transferring the charge signals. This is also true of other pixel parts. Here, in the light-receiving unit 10C of this modification example, the pixel parts (that is, the first pixel parts 22C, the second pixel parts 23C, the third pixel parts 32C, and the fourth pixel parts 33C) are divided into two parts, and thus it is possible to shorten a movement distance of the charge signals generated in the pixel parts in the pixel parts. According to this, it is possible to suppress time necessary for reading-out the charge signals, and it is possible to realize a high frame rate.

Third Modification Example

Figure 8:
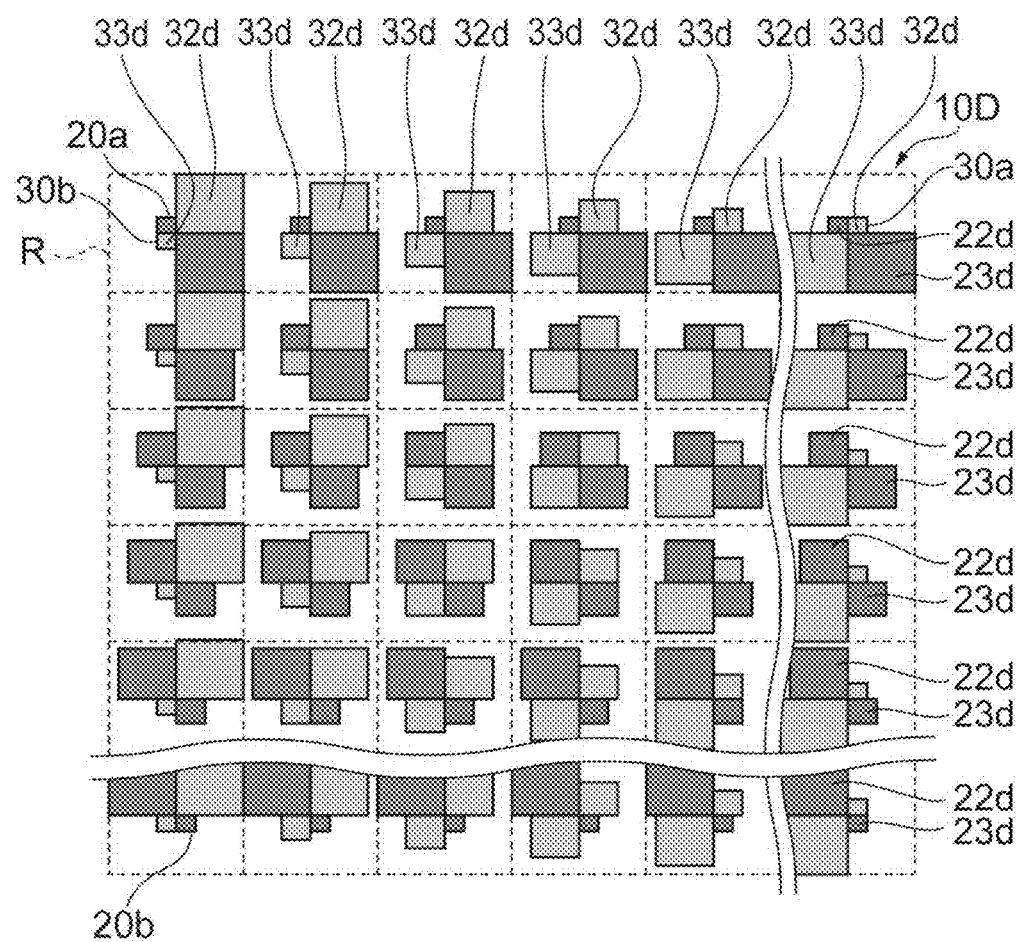
FIG. 8 is a schematic configuration diagram illustrating a light-receiving unit according to a third modification example.
Figure 9:
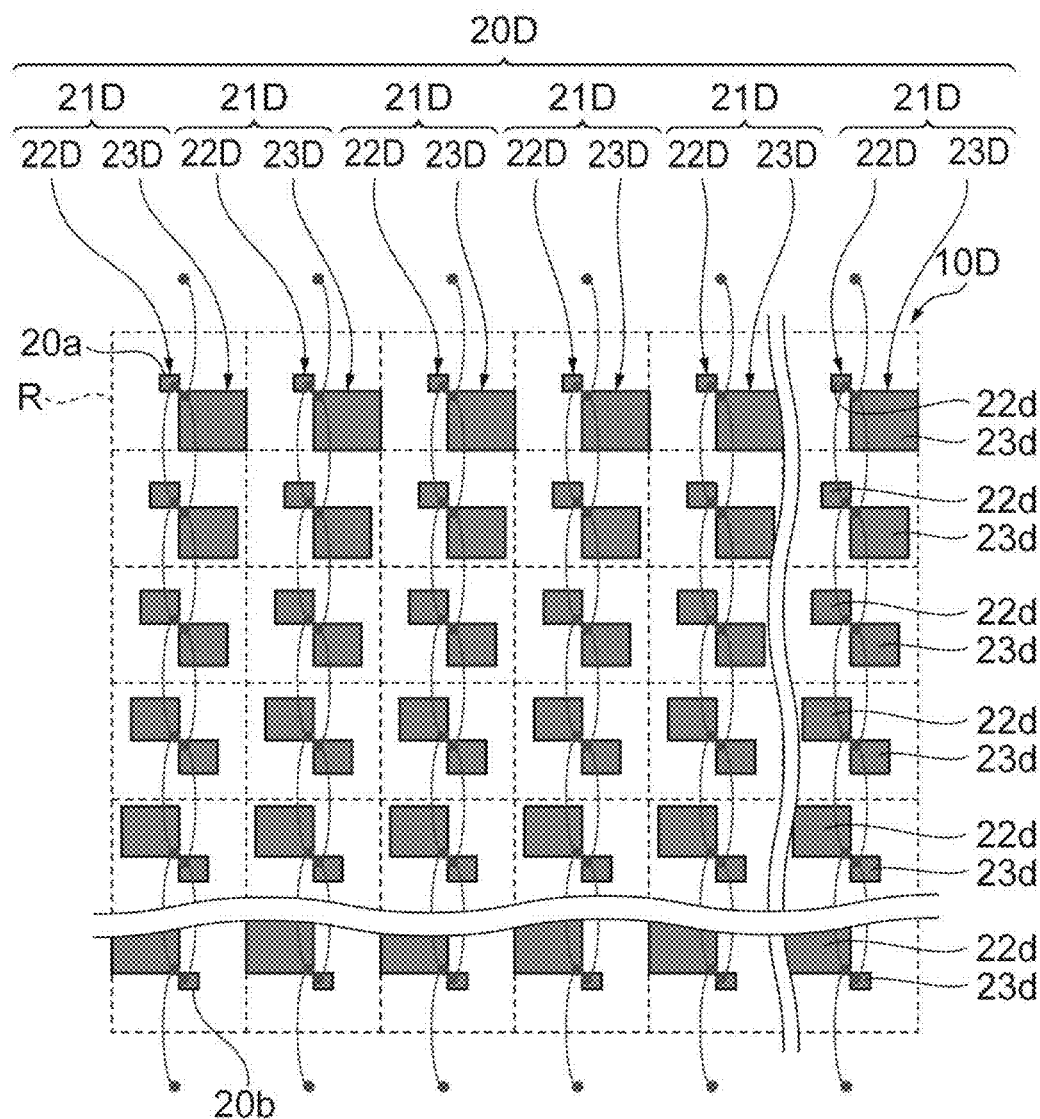
FIG. 9 is a schematic configuration diagram illustrating a first pixel pair group of the light-receiving unit according to the third modification example.
Figure 10:
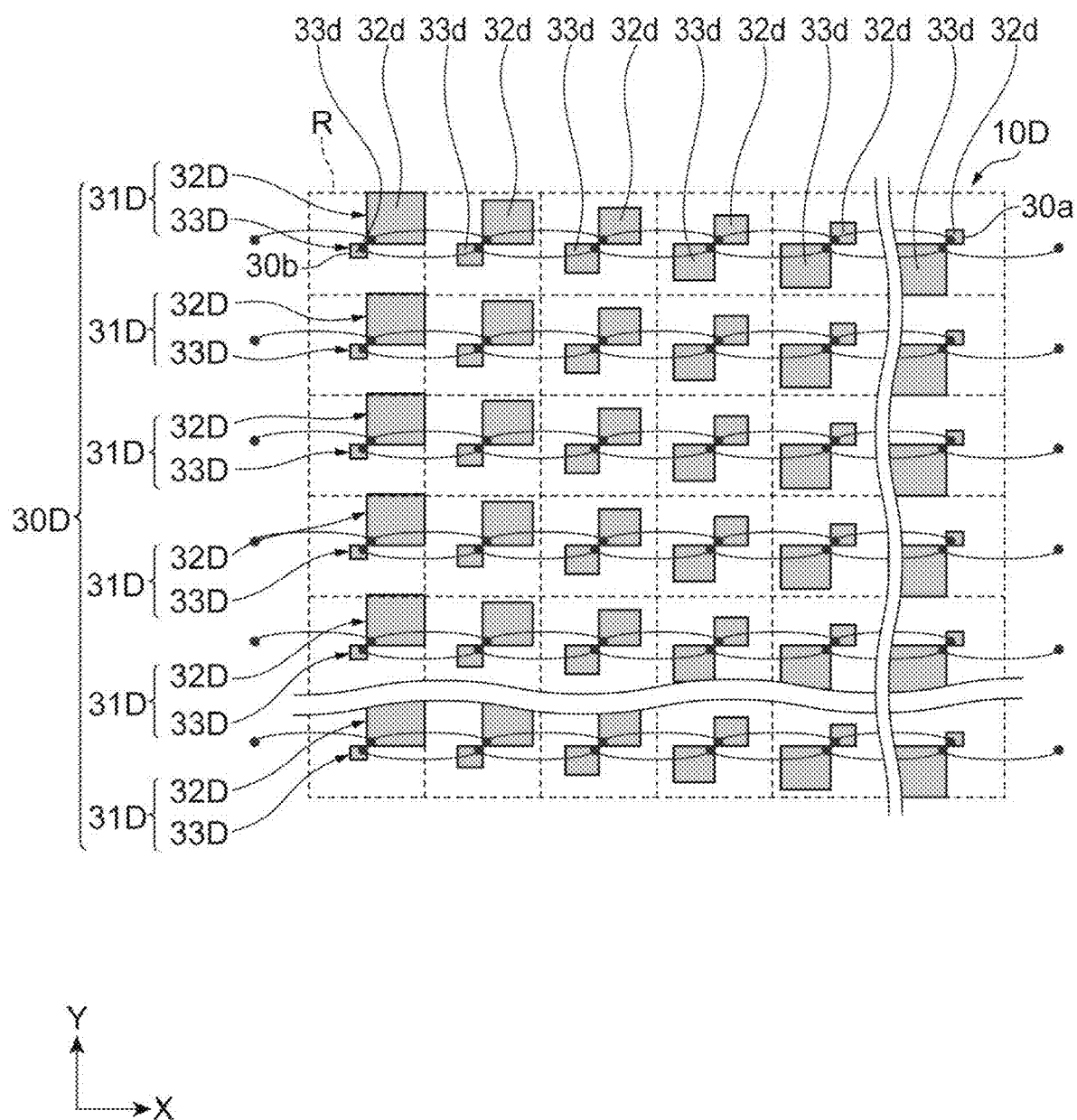
FIG. 10 is a schematic configuration diagram illustrating a second pixel pair group of the light-receiving unit according to the third modification example.

FIG. 8 is a schematic configuration diagram illustrating a light-receiving unit 10D according to a third modification example. FIG. 9 is a schematic configuration diagram illustrating a first pixel pair group 20D of the light-receiving unit 10D according to this modification example. FIG. 10 is a schematic configuration diagram illustrating a second pixel pair group 30D of the light-receiving unit 10D according to this modification example.

As illustrated in FIG. 9, a first pixel part 22D of each first pixel pair 21D of the first pixel pair group 20D includes a plurality of first pixels 22d. For example, the first pixels 22d have a square shape and are arranged along the Y-axis direction. The first pixels 22d are wired to each other in the Y-axis direction. A width of each of the first pixel 22d in the X-axis direction is smaller as the first pixel 22d is closer to the one end 20a in the Y-axis direction, and is larger as the first pixel 22d is closer to the other end 20b in the Y-axis direction. A width of the first pixel 22d in the Y-axis direction shows the same variation as the variation of the width of the first pixel 22d in the X-axis direction. That is, the width of the first pixel 22d in the Y-axis direction is smaller as the first pixel 22d is closer to the one end 20a in the Y-axis direction, and is larger as the first pixel 22d is closer to the other end 20b in the Y-axis direction. An area of the first pixel 22d is also smaller as the first pixel 22d is closer to the one end 20a in the Y-axis direction, and is also larger as the first pixel 22d is closer to the other end 20b in the Y-axis direction.

A second pixel part 23D of the first pixel pair 21D includes a plurality of second pixels 23d. For example, the second pixels 23d have a square shape and are arranged along the Y-axis direction. The second pixels 23d are wired to each other in the Y-axis direction. A width of the second pixel part 23D in the X-axis direction is larger as the second pixel 23d is closer to the one end 20a in the Y-axis direction, and is smaller as the second pixel 23d is closer to the other end 20b in the Y-axis direction. A width of the second pixel 23d in the Y-axis direction shows the same variation as the variation of the width of the second pixel 23d in the X-axis direction. That is, the width of the second pixel 23d in the Y-axis direction is larger as the second pixel 23d is closer to the one end 20a in the Y-axis direction, and is smaller as the second pixel 23d is closer to the other end 20b in the Y-axis direction. Accordingly, an area of the second pixel 23d is also larger as the second pixel 23d is closer to the one end 20a in the Y-axis direction, and is also smaller as the second pixel 23d is closer to the other end 20b in the Y-axis direction.

When the first pixel pair group 20D includes the second pixel parts 23D and the second pixel parts 23D, the following operation is obtained. That is, in the first pixel parts 22D, as the incident position of the light spot L is closer to the one end 20a in the Y-axis direction, an incident light amount of the light spot L incident to the first pixel parts 22D decreases, and according to this, the intensities of the first charge signals generated in the first pixel parts 22D also decrease. In contrast, in the second pixel parts 23D, as the incident position of the light spot L is closer to the one end 20a in the Y-axis direction, an incident light amount of the light spot L incident to the second pixel parts 23D increases, and according to this, the intensities of the second charge signals generated in the second pixel parts 23D also increase.

As illustrated in FIG. 10, a third pixel part 32D of each second pixel pair 31D of the second pixel pair group 30D includes a plurality of third pixels 32d. For example, the third pixels 32d have a square shape and are arranged along the X-axis direction. The third pixels 32d are wired to each other along the X-axis direction. A width of each of the third pixels 32d in the Y-axis direction is smaller as the third pixel 32d is closer to the one end 30a in the X-axis direction, and is larger as the third pixel 32d is closer to the other end 30b in the X-axis direction. A width of the third pixel 32d in the X-axis direction shows the same variation as the variation of the width of the third pixel 32d in the Y-axis direction. That is, the width of the third pixel 32d in the X-axis direction is smaller as the third pixel 32d is closer to the one end 30a in the X-axis direction, and is larger as the third pixel 32d is closer to the other end 30b in the X-axis direction. An area of the third pixel 32d is also smaller as the third pixel 32d is closer to the one end 30a in the X-axis direction, and is also larger as the third pixel 32d is closer to the other end 30b in the X-axis direction.

A fourth pixel part 33D of the second pixel pair 31D includes a plurality of fourth pixels 33d. For example, the fourth pixels 33d have a square shape and are arranged along the X-axis direction. The fourth pixels 33d are wired to each other in the X-axis direction. A width of the fourth pixel part 33D in the Y-axis direction is larger as the fourth pixel 33d is closer to the one end 30a in the X-axis direction, and is smaller as the fourth pixel 33d is closer to the other end 30b in the X-axis direction. A width of the fourth pixel 33d in the X-axis direction shows the same variation as the variation of the width of the fourth pixel 33d in the Y-axis direction. That is, the width of the fourth pixel 33d in the X-axis direction is larger as the fourth pixel 33d is closer to the one end 30a in the X-axis direction, and is smaller as the fourth pixel 33d is closer to the other end 30b in the X-axis direction. Accordingly, an area of the fourth pixel 33d is also larger as the fourth pixel 33d is closer to the one end 30a in the X-axis direction, and is also smaller as the fourth pixel 33d is closer to the other end 30b in the X-axis direction.

When the second pixel pair group 30D includes the third pixel part 32D and the fourth pixel part 33D, the following operation is obtained. That is, in the third pixel parts 32D, as the incident position of the light spot L is closer to the one end 30a in the X-axis direction, an incident light amount of the light spot L incident to the third pixel parts 32D decreases, and according to this, the intensities of the third charge signals generated in the third pixel parts 32D also decrease. In contrast, in the fourth pixel parts 33D, as the incident position of the light spot L is closer to the one end 30a in the X-axis direction, an incident light amount of the light spot L incident to the fourth pixel parts 33D increases, and according to this, the intensities of the fourth charge signals generated in the fourth pixel parts 33D also increase.

As illustrated in FIG. 8, FIG. 9, and FIG. 10, the light-receiving unit 10D is partitioned by a plurality of regions R which are two-dimensionally arranged along the X-axis direction and the Y-axis direction. The first pixel 22d, the second pixel 23d, the third pixel 32d, and the fourth pixel 33d are included in each of the regions R.

Figure 11:
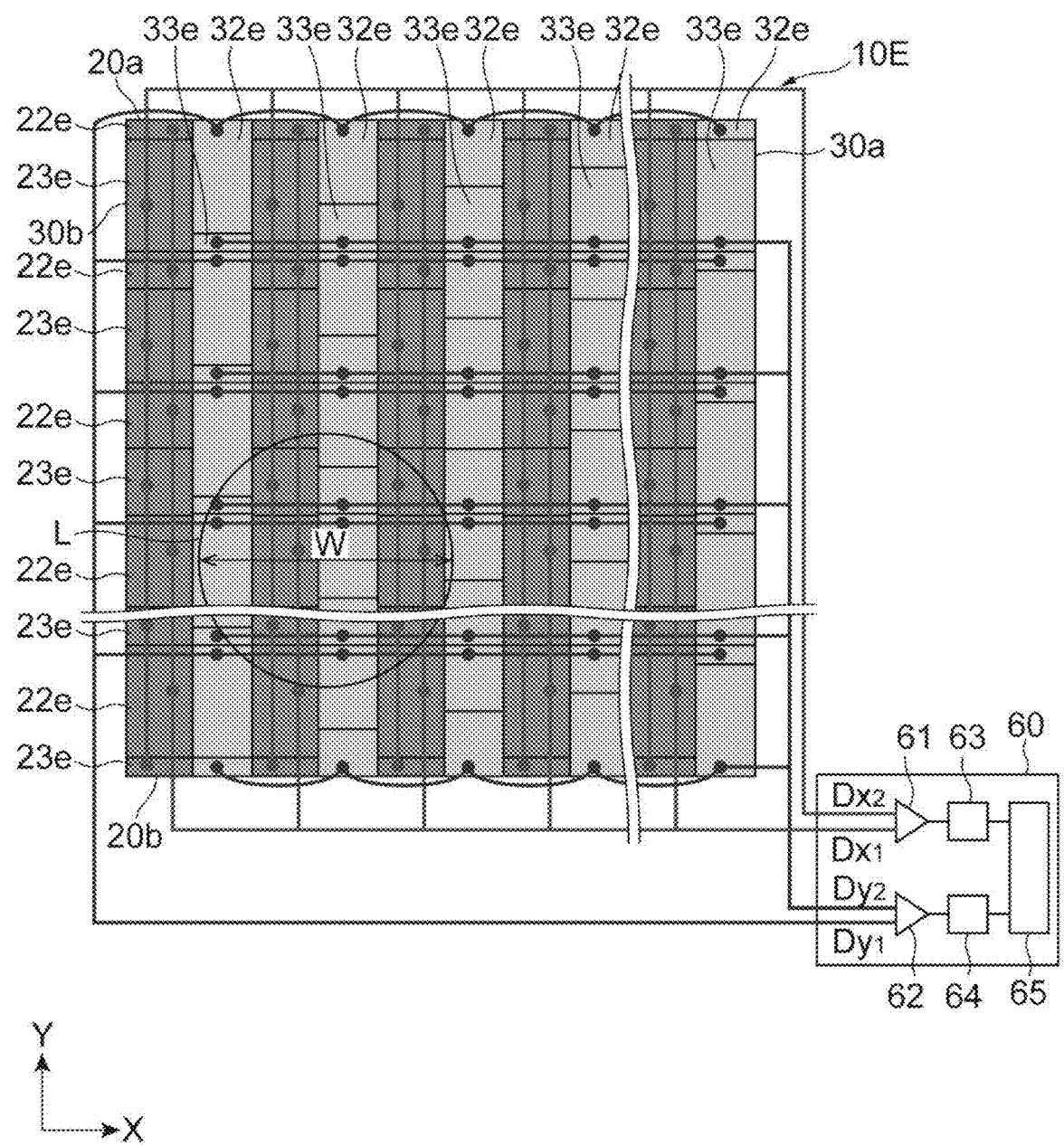
FIG. 11 is a schematic configuration diagram illustrating a position detection sensor including a light-receiving unit according to another example of the third modification example.
Figure 12:
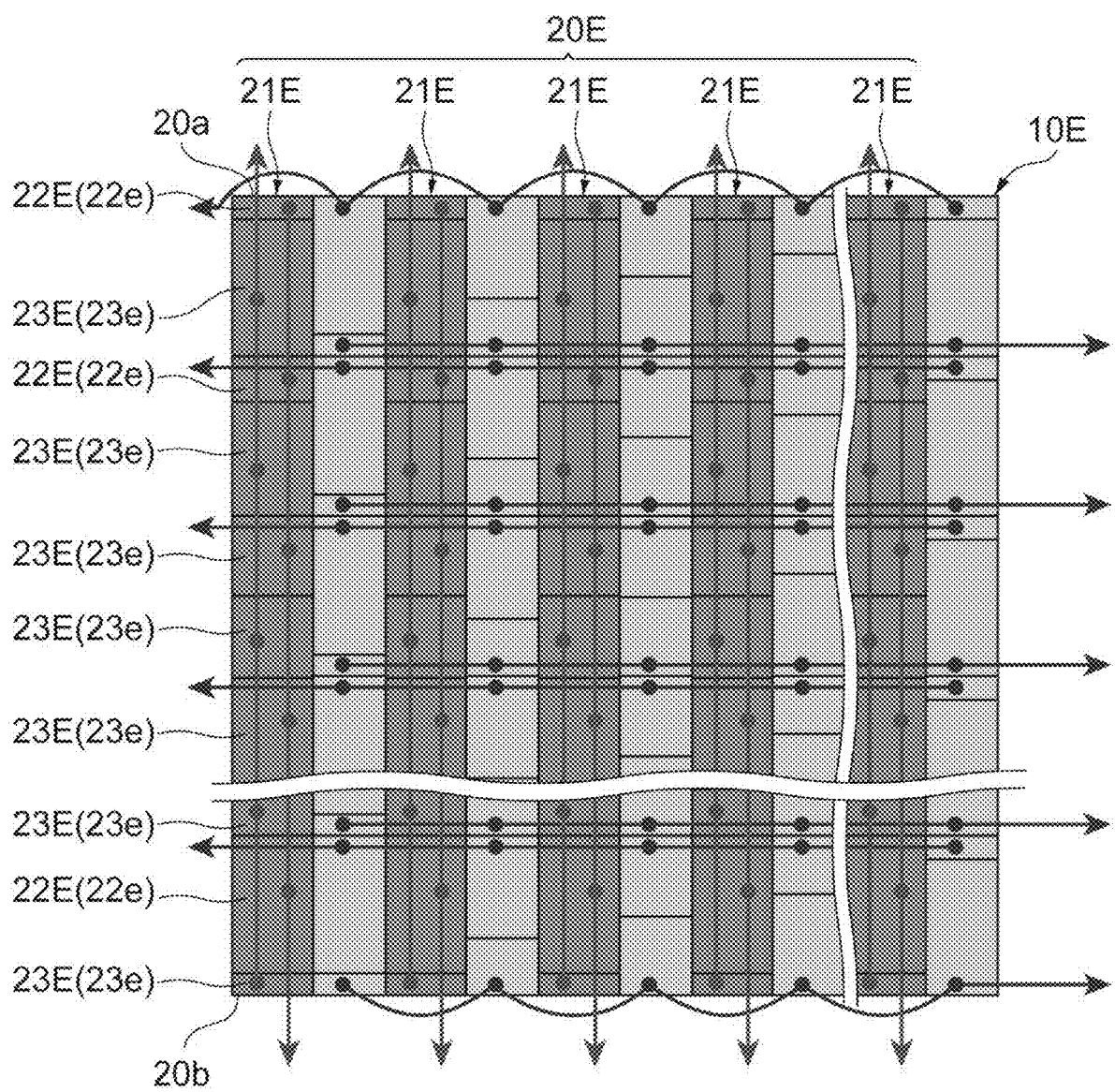
FIG. 12 is a schematic configuration diagram illustrating a light-receiving unit according to another example of the third modification example.
Figure 13:
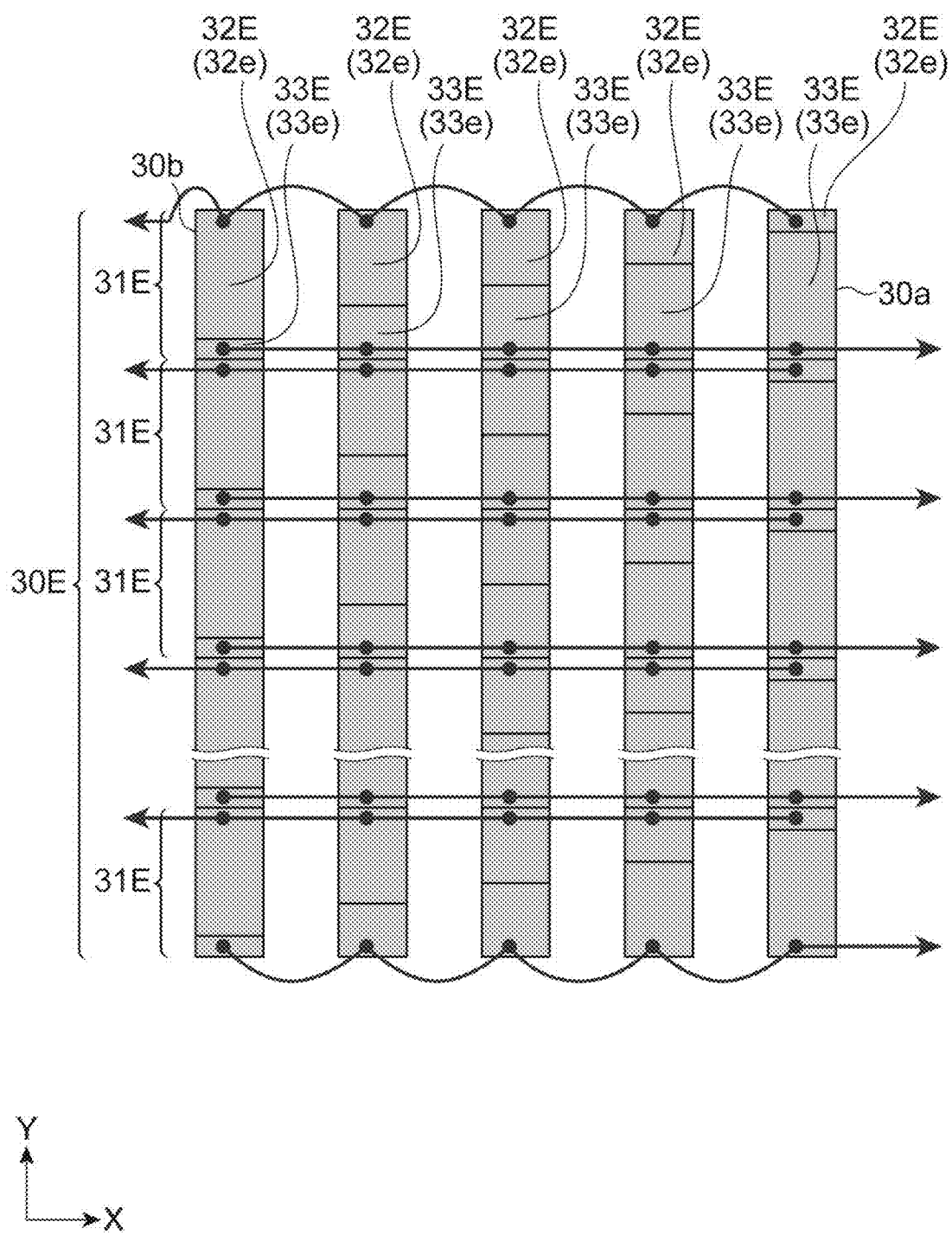
FIG. 13 is schematic configuration diagram illustrating a second pixel pair group of the light-receiving unit according to the other example of the third modification example.

FIG. 11 is a schematic configuration diagram illustrating a position detection sensor 1E including a light-receiving unit 10E according to another example of this modification example. As illustrated in FIG. 11, the position detection sensor 1E includes the light-receiving unit 10E and the operation processing unit 60. FIG. 12 is a schematic configuration diagram illustrating the light-receiving unit 10E according to this modification example. FIG. 13 is a schematic configuration diagram illustrating a second pixel pair group 30E of the light-receiving unit 10E according to this modification example. In FIG. 13, a first pixel pair group 20E illustrated in FIG. 12 is omitted.

A difference between the light-receiving unit 10E according to this modification example and the light-receiving unit 10D is in a shape and arrangement of pixels. As illustrated in FIG. 12, in first pixel pairs 21E of the first pixel pair group 20E, for example, first pixels 22e of a first pixel part 22E and second pixels 23e of a second pixel part 23E have a rectangular shape, and are alternately disposed to be in contact with each other in the Y-axis direction. A width of each of the first pixels 22e in the X-axis direction and a width of each of the second pixels 23e in the X-axis direction match each other, and are constant regardless of a position in the Y direction.

A width of the first pixel 22e in the Y-axis direction shows the same variation as the variation of the width of the first pixel 22d in the Y-axis direction. That is, the width of the first pixel 22e in the Y-axis direction is smaller as the first pixel 22e is closer to the one end 20a in the Y-axis direction, and is larger as the first pixel 22e is closer to the other end 20b in the Y-axis direction. Accordingly, an area of the first pixel 22e is also smaller as the first pixel 22e is closer to the one end 20a in the Y-axis direction, and is also larger as the first pixel 22e is closer to the other end 20b in the Y-axis direction.

A width of the second pixel 23e in the Y-axis direction shows the same variation as the variation of the width of the second pixel 23d in the Y-axis direction. That is, the width of the second pixel 23e in the Y-axis direction is larger as the second pixel 23e is closer to the one end 20a in the Y-axis direction, and is smaller as the second pixel 23e is closer to the other end 20b in the Y-axis direction. Accordingly, an area of the second pixel 23e is also larger as the second pixel 23e is closer to the one end 20a in the Y-axis direction, and is also smaller as the second pixel 23e is closer to the other end 20b in the Y-axis direction.

As illustrated in FIG. 13, in second pixel pairs 31E of the second pixel pair group 30E, for example, third pixels 32e of a third pixel part 32E and fourth pixels 33e of a fourth pixel part 33E have a rectangular shape, and are alternately disposed to be in contact with each other in the Y-axis direction. A width of each of the third pixels 32e in the X-axis direction and a width of each of the fourth pixels 33e in the X-axis direction match each other, and are constant regardless of a position in the Y-axis direction. A width of each of the third pixel 32e and the fourth pixel 33e in the X-axis direction is the same as the width of each of the first pixel 22e and the second pixel 23e in the X-axis direction.

A width of the third pixel 32e in the Y-axis direction shows the same variation as the variation of the width of the third pixel 32d in the Y-axis direction. That is, the width of the third pixel 32e in the Y-axis direction is smaller as the third pixel 32e is closer to the one end 30a in the X-axis direction, and is larger as the third pixel 32e is closer to the other end 30b in the X-axis direction. Accordingly, an area of the third pixel 32e is also smaller as the third pixel 32e is closer to the one end 30a in the X-axis direction, and is also larger as the third pixel 32e is closer to the other end 30b in the X-axis direction.

A width of the fourth pixel 33e in the Y-axis direction shows the same variation as the variation of the width of the fourth pixel 33d in the Y-axis direction. That is, the width of the fourth pixel 33e in the Y-axis direction is larger as the fourth pixel 33e is closer to the one end 30a in the X-axis direction, and is smaller as the fourth pixel 33e is closer to the other end 30b in the X-axis direction. Accordingly, an area of the fourth pixel 33e is also larger as the fourth pixel 33e is closer to the one end 30a in the X-axis direction, and is also smaller as the fourth pixel 33e is closer to the other end 30b in the X-axis direction.

Referring to FIG. 11, FIG. 12, and FIG. 13, the first pixel pair group 20E and the second pixel pair group 30E are alternately aligned to be in contact with each other in the Y-axis direction, and thus it can be understood that the first pixel 22e, the second pixel 23e, the third pixel 32e, and the fourth pixel 33e are disposed with no gap therebetween. When the pixels are disposed in this manner, it is possible to improve an aperture ratio of the light-receiving unit 10E. As a result, it is possible to raise sensitivity with respect to the incident light spot L, and it is possible to realize enlargement of a dynamic range.

As illustrated in FIG. 11, the amplifier 61 of the operation processing unit 60 is electrically connected to the plurality of first pixel parts 22E (refer to FIG. 12) and the plurality of second pixel parts 23E (refer to FIG. 12). On the other hand, the amplifier 62 of the operation processing unit 60 is electrically connected to the plurality of third pixel parts 32E (refer to FIG. 13) and the plurality of fourth pixel parts 33E (refer to FIG. 13). In the position detection sensor 1E, when the light spot L is incident to the light-receiving unit 10E, the integrated value Dx1 of intensities of a plurality of first charge signals and the integrated value Dx2 of intensities of a plurality of second charge signals are input to the amplifier 61. On the other hand, the integrated value Dy1 of intensities of third charge signals and the integrated value Dy2 of intensities of fourth charge signals are input to the amplifier 62. As the position detection sensor 1 of the embodiment, the calculation unit 65 calculates a first detection position and a second detection position on the basis of the integrated values Dx1, Dx2, Dy1, and Dy2. According to the position detection sensor 1E according to this modification example, it is possible to obtain the same effect as the effect of the position detection sensor 1 of the embodiment.

Fourth Modification Example

Figure 14:
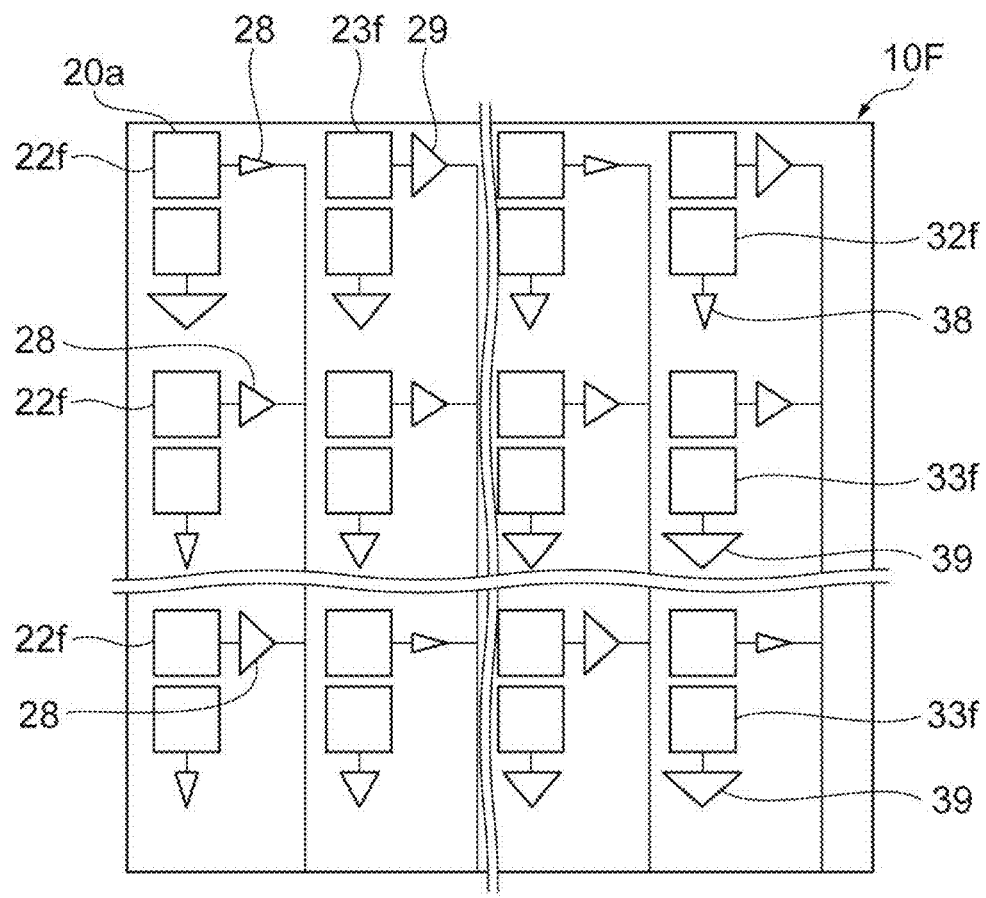
FIG. 14 is a schematic configuration diagram illustrating a light-receiving unit according to a fourth modification example.
Figure 15:
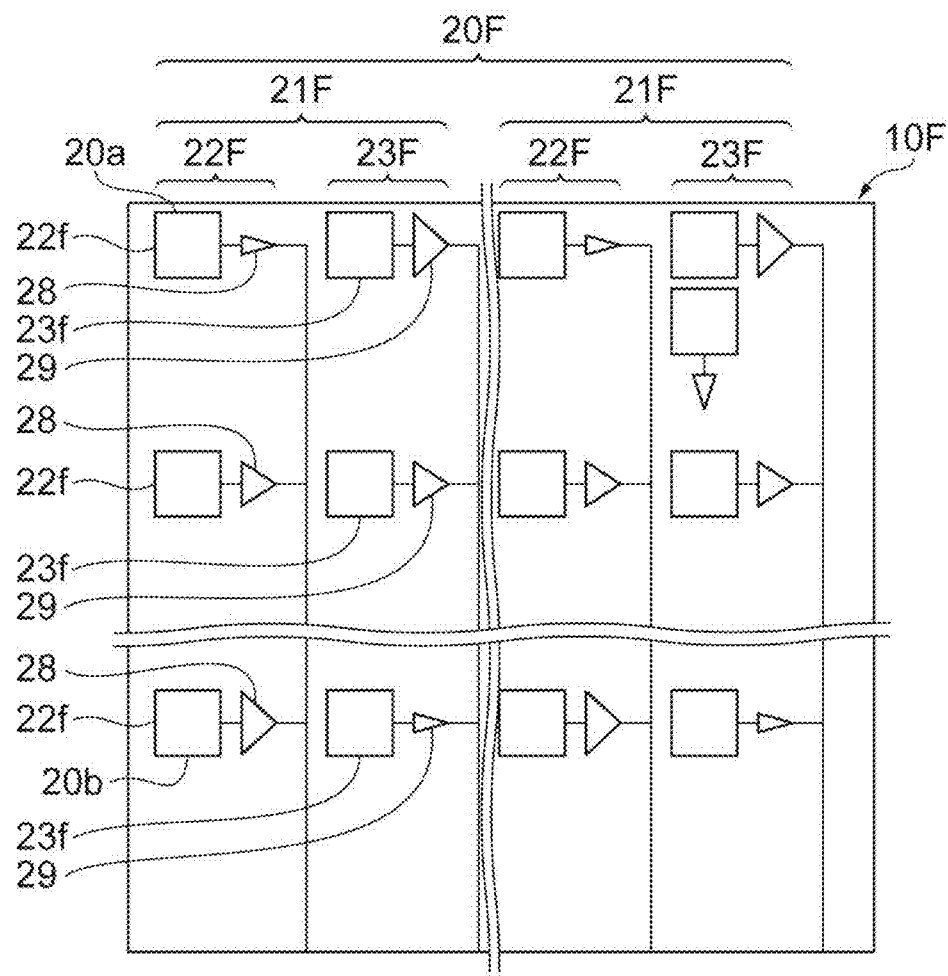
FIG. 15 is a schematic configuration diagram illustrating a first pixel pair group of the light-receiving unit according to the fourth modification example.
Figure 16:
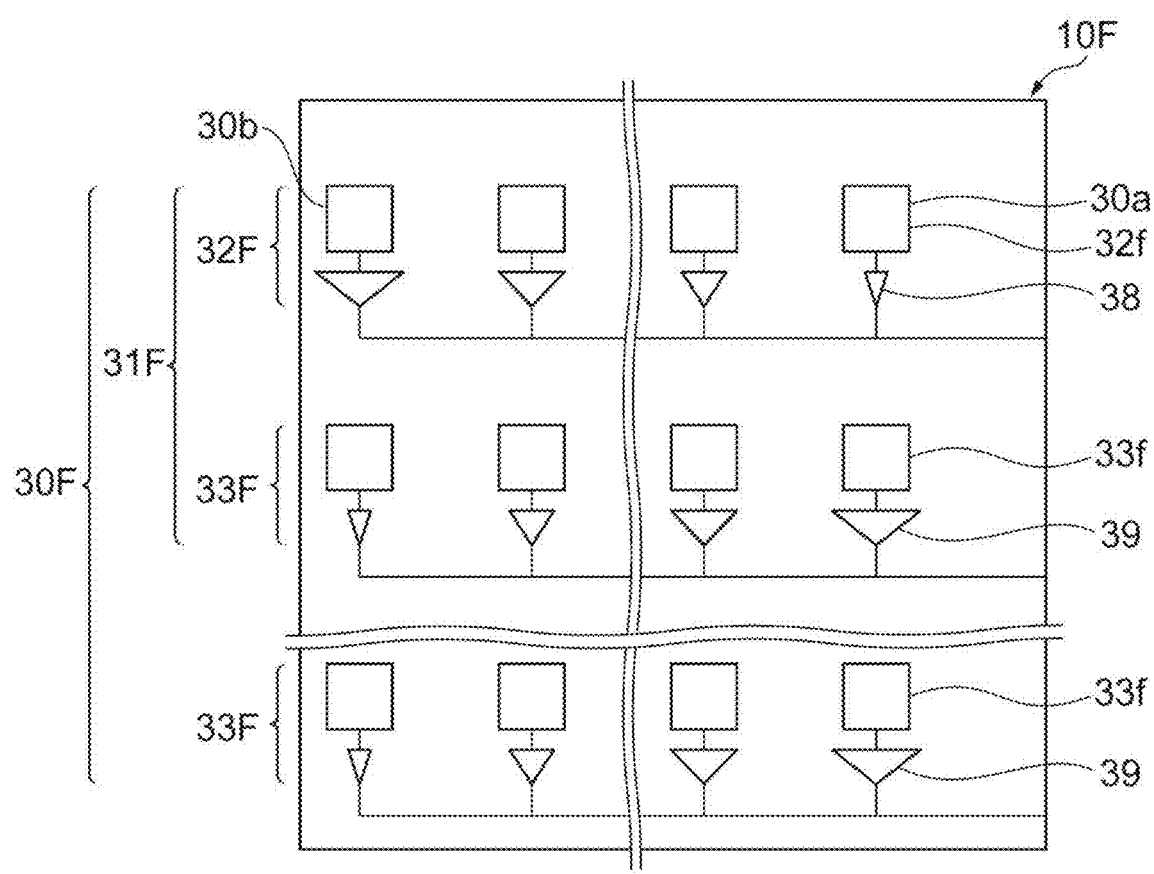
FIG. 16 is a schematic configuration diagram illustrating a second pixel pair group of the light-receiving unit according to the fourth modification example.

FIG. 14 is a schematic configuration diagram illustrating a light-receiving unit 10F according to a fourth modification example. FIG. 15 is a schematic configuration diagram illustrating a first pixel pair group 20F of the light-receiving unit 10F according to this modification example. FIG. 16 is a schematic configuration diagram illustrating a second pixel pair group 30F of the light-receiving unit 10F according to this modification example.

As illustrated in FIG. 15, a first pixel part 22F of first pixel pairs 21F of the first pixel pair group 20F includes a plurality of first pixels 22f and a plurality of first amplifiers 28. For example, the plurality of first pixels 22f have a square shape and are arranged along the Y-axis direction. Areas of the first pixels 22f are the same as each other. The first amplifiers 28 are electrically connected to the first pixels 22f. Each of the first amplifiers 28 amplifies an intensity of a charge signal generated in each of the first pixels 22f. An amplification rate of the first amplifier 28 is smaller as the first pixel 22f electrically connected to the first amplifier 28 is closer to the one end 20a of the first pixel pair group 20F in the Y-axis direction, and is larger as the first pixel 22f is closer to the other end 20b in the Y-axis direction. Output terminals of the first amplifiers 28 are wired to each other in the Y-axis direction, and are electrically connected to the input terminal of the amplifier 61 (refer to FIG. 1).

A second pixel part 23F of the first pixel pairs 21F includes a plurality of second pixels 23f and a plurality of second amplifiers 29. For example, the plurality of second pixels 23f have a square shape and are arranged along the Y-axis direction. Areas of the second pixels 23f are the same as each other. The second amplifiers 29 are electrically connected to the second pixels 23f. Each of the second amplifiers 29 amplifies an intensity of a charge signal generated in each of the second pixels 23f. An amplification rate of the second amplifier 29 is larger as the second pixel 23*f* electrically connected to the second amplifier 29 is closer to the one end 20*a* in the Y-axis direction, and is smaller as the second pixel 23*f* is closer to the other end 20*b* in the Y-axis direction. Output terminals of the second amplifiers 29 are wired to each other in the Y-axis direction, and are electrically connected to the input terminal of the amplifier 61 (refer to FIG. 1). Charge signals amplified by the first amplifiers 28 are collectively input to the input terminal of the amplifier 61, and charge signals amplified by the second amplifiers 29 are collectively input to the input terminal.

When the first pixel pair group 20F includes the first pixel part 22F and the second pixel part 23F, the following operation is obtained. That is, in the first pixel part 22F, as an incident position of the light spot L is closer to the one end 20*a* in the Y-axis direction, the intensity of the first charge signal output from the first pixel part 22F decreases. In contrast, in the second pixel part 23F, as the incident position of the light spot L is closer to the one end 20*a* in the Y-axis direction, the intensity of the second charge signal output from the second pixel part 23F increases.

As illustrated in FIG. 16, a third pixel part 32F of second pixel pairs 31F of the second pixel pair group 30F includes a plurality of third pixels 32*f* and a plurality of third amplifiers 38. For example, the plurality of third pixels 32*f* have a square shape and are arranged along the X-axis direction. Areas of the third pixels 32*f* are the same as each other. The third amplifiers 38 are electrically connected to the third pixels 32*f*. Each of the third amplifiers 38 amplifies an intensity of a charge signal generated in each of the third pixels 32*f*. An amplification rate of the third amplifier 38 is smaller as the third pixel 32*f* electrically connected to the third amplifier 38 is closer to the one end 30*a* of the first pixel pair group 20F in the X-axis direction, and is larger as the third pixel 32*f* is closer to the other end 30*b* in the X-axis direction. Output terminals of the third amplifiers 38 are wired to each other in the X-axis direction, and are electrically connected to the input terminal of the amplifier 62 (refer to FIG. 1).

A fourth pixel part 33F of the second pixel pairs 31F includes a plurality of fourth pixels 33*f* and a plurality of fourth amplifiers 39. For example, the plurality of fourth pixels 33*f* have a square shape and are arranged along the X-axis direction. Areas of the fourth pixels 33*f* are the same as each other. The fourth amplifiers 39 are electrically connected to the fourth pixels 33*f*. Each of the fourth amplifiers 39 amplifies an intensity of a charge signal generated in each of the fourth pixels 33*f*. An amplification rate of the fourth amplifier 39 is larger as the fourth pixel 33*f* electrically connected to the fourth amplifier 39 is closer to the one end 30*a* in the X-axis direction, and is smaller as the fourth pixel 33*f* is closer to the other end 30*b* in the X-axis direction. Output terminals of the fourth amplifiers 39 are wired to each other in the X-axis direction, and are electrically connected to the input terminal of the amplifier 62 (refer to FIG. 1). Charge signals amplified by the third amplifiers 38 are collectively input to the input terminal of the amplifier 62 and charge signals amplified by the fourth amplifiers 39 are collectively input to the input terminal.

When the second pixel pair group 30F includes the third pixels 32*f* and the fourth pixels 33*f*, the following operation is obtained. That is, in the third pixel part 32F, as the incident position of the light spot L is closer to the one end 30*a* in the X-axis direction, an intensity of the third charge signal output from the third pixel part 32F decreases. In contrast, in the fourth pixel part 33F, as the incident position of the light spot L is closer to the one end 30*a* in the X-axis direction, an intensity of the fourth charge signal output from the fourth pixel part 33F increases.

Fifth Modification Example

Figure 17:
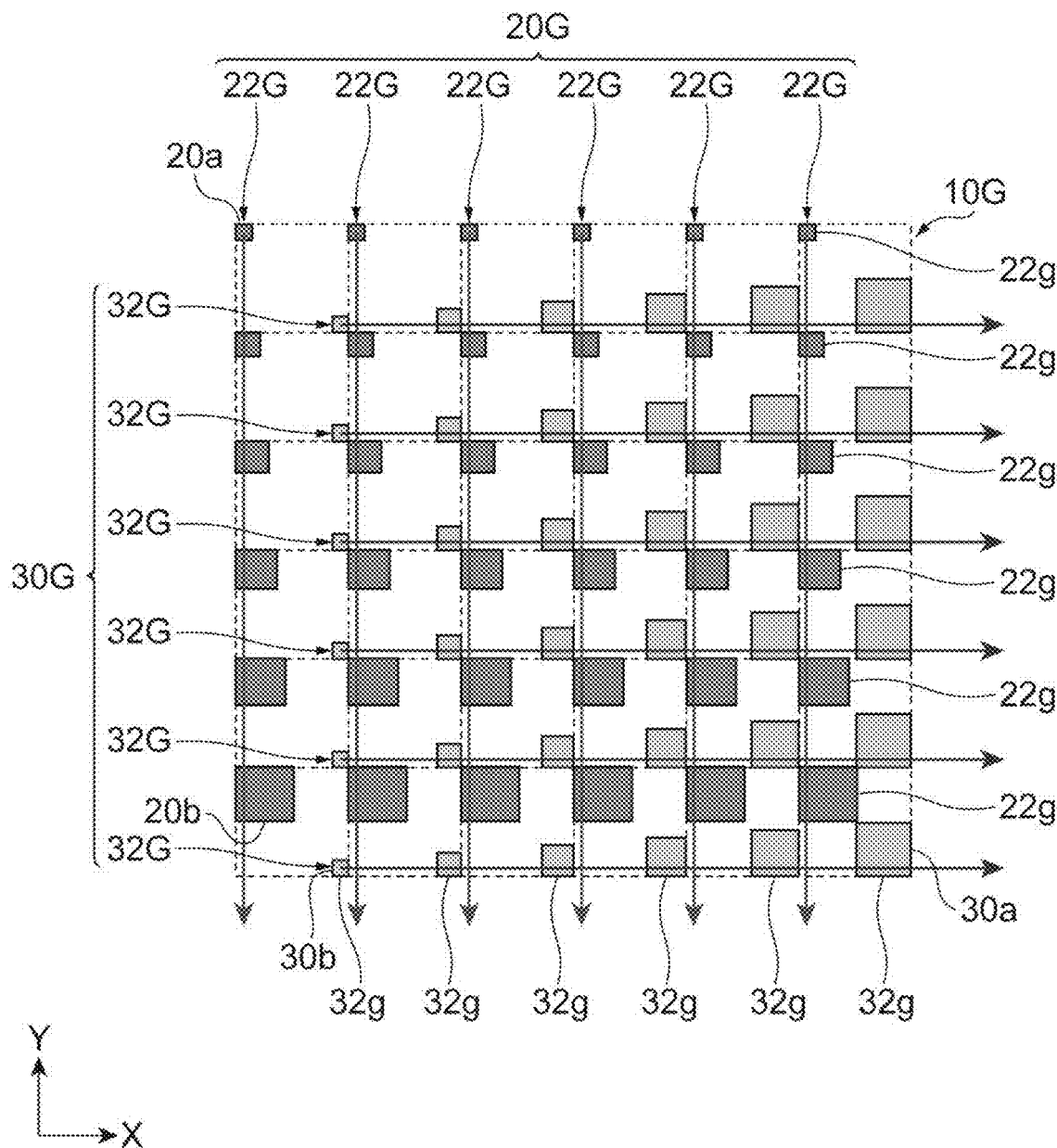
FIG. 17 is a schematic configuration diagram illustrating a light-receiving unit according to a fifth modification example.

FIG. 17 is a schematic configuration diagram illustrating a light-receiving unit 10G according to a fifth modification example. A first pixel part 22G of a first pixel group 20·3 of the light-receiving unit 10G includes a plurality of first pixels 22*g*. The first pixel group 20G corresponds to the first pixel pair group 20 in the embodiment. For example, the first pixels 22*g* have a square shape, and are arranged along the Y-axis direction. The first pixels 22*g* are wired to each other in the Y-axis direction. A width of each of the first pixels 22*g* in the X-axis direction is smaller as the first pixel 22*g* is closer to the one end 20*a* in the Y-axis direction, and is larger as the first pixel 22*g* is closer to the other end 20*b* in the Y-axis direction. A width of the first pixel 22*g* in the Y-axis direction shows the same variation as the variation of the width of the first pixel 22*g* in the X-axis direction. That is, the width of the first pixel 22*g* in the Y-axis direction is smaller as the first pixel 22*g* is closer to the one end 20*a* in the Y-axis direction, and is larger as the first pixel 22*g* is closer to the other end 20*b* in the Y-axis direction. Accordingly, an area of the first pixel 22*g* is also smaller as the first pixel 22*g* is closer to the one end 20*a* in the Y-axis direction, and is also larger as the first pixel 22*g* is closer to the other end 20*b* in the Y-axis direction. When the first pixel group 20G includes the first pixel parts 223, in the first pixel parts 22G, as the incident position of the light spot L is closer to the one end 20*a* in the Y-axis direction, an incident light amount of the light spot L incident to the first pixel parts 22G decreases, and according to this, intensities of first charge signals (first electric signals) generated in the first pixel parts 22G also decrease.

A second pixel part 32G of a second pixel group 30G of the light-receiving unit 10G includes a plurality of second pixels 32*g*. The second pixel group 30G corresponds to the second pixel pair group 30 in the embodiment. The second pixel part 32G corresponding to the fourth pixel part 33 in the embodiment. For example, the second pixels 32*g* have a square shape, and are arranged along the X-axis direction. The second pixels 32*g* are wired to each other in the X-axis direction. A width of each of the second pixels 32*g* in the Y-axis direction is larger as the second pixel 32*g* is closer to the one end 30*a* in the X-axis direction, and is smaller as the second pixel 32*g* is closer to the other end 30*b* in the X-axis direction. A width of the second pixel 32*g* in the X-axis direction shows the same variation as the variation of the width of the second pixel 32*g* in the Y-axis direction. That is, the width of the second pixel 32*g* in the X-axis direction is larger as the second pixel 32*g* is closer to the one end 30*a* in the X-axis direction, and is smaller as the second pixel 32*g* is closer to the other end 30*b* in the X-axis direction. Accordingly, an area of the second pixel 32*g* is also larger as the second pixel 32*g* is closer to the one end 30*a* in the X-axis direction, and is also smaller as the second pixel 32*g* is closer to the other end 30*b* in the X-axis direction. When the second pixel group 30G includes the second pixel parts 32G, in the second pixel parts 32E as the incident position of the light spot L is closer to the one end 30*a* in the X-axis direction, an incident light amount of the light spot L incident to the second pixel parts 32G increases, and according to this, intensities of second charge signals (second electric signals) generated in the second pixel parts 32G also increase.

The calculation unit 65 (refer to FIG. 1) calculates the second detection position that is an incident position of the light spot L in the Y-axis direction by using the integrated value Dx1 of the first charge signals generated in the plurality of first pixel parts 22G. In addition, the calculation unit 65 calculates the first detection position that is an incident position of the light spot L in the X-axis direction by using the integrated value Dy1 of the second charge signals generated in the plurality of second pixel parts 32G. Accordingly, according to the position detection sensor, it is possible to the same effect as described above.

The position detection sensor of the present disclosure is not limited to the above-described embodiment and examples, and various modifications can be made. For example, the above-described embodiment and modification examples may be combined in correspondence with an object and an effect which are required.

REFERENCE SIGNS LIST 1, 1E: position detection sensor, 10, 10A to 10G: light-receiving unit, 20, 20A to 20F: first pixel pair group, 20G: first pixel group, 20a, 30a: one end, 20b, 30b: another end, 21, 21B to 21F: first pixel pair, 22, 22B to 22G: first pixel part, 22a, 23a, 32a, 33a: one portion, 22d to 22g: first pixel, 23, 23B to 23F, 32G: second pixel part, 23d to 23f, 32g: second pixel, 24: first transmission filter, 25: second transmission filter, 26: first light-shielding part, 27: second light-shielding part, 28: first amplifier, 29: second amplifier, 30, 30A to 30F: second pixel pair group, 30G: second pixel group, 31, 31B to 31F: second pixel pair, 32, 32B to 32F: third pixel part, 32d to 32f: third pixel, 33, 33B to 33F: fourth pixel part, 33d to 33f: fourth pixel, 34: third transmission filter, 35: fourth transmission filter, 36: third light-shielding part, 37: four light-shielding part, 38: third amplifier, 39: fourth amplifier, 60: operation processing unit, 61, 62: amplifier, 63, 64: A/D converter, 65: calculation unit, Dx1, Dx2, Dy1, Dy2: integrated value, L: light spot.

The invention claimed is:

1. A position detection sensor that detects an incident position of light, comprising:
a first pixel pair group that includes a plurality of first pixel pairs arranged along a first direction, each of the first pixel pairs including a first pixel part that generates a first electric signal corresponding to an incident light amount of the light and a second pixel part that is disposed side by side with the first pixel part in the first direction and generates a second electric signal corresponding to an incident light amount of the light;
a second pixel pair group that includes a plurality of second pixel pairs arranged along a second direction, each of the second pixel pairs including a third pixel part that generates a third electric signal corresponding to an incident light amount of the light and a fourth pixel part that is disposed side by side with the third pixel part in the second direction intersecting the first direction and generates a fourth electric signal corresponding to an incident light amount of the light, and the second pixel pair group intersecting the first pixel pair group; and
a calculation unit that calculates a first position that is the incident position in the first direction, and a second position that is the incident position in the second direction, wherein in the first pixel part, as the incident position is closer to a first end of the first pixel pair group in the second direction, an intensity of the first electric signal decreases,
in the second pixel part, as the incident position is closer to the first end in the second direction, an intensity of the second electric signal increases,
in the third pixel part, as the incident position is closer to a second end of the second pixel pair group in the first direction, an intensity of the third electric signal decreases,
in the fourth pixel part, as the incident position is closer to the second end in the first direction, an intensity of the fourth electric signal increases, and
the calculation unit calculates the second position on the basis of an integrated value of the intensity of the first electric signal and an integrated value of the intensity of the second electric signal, and calculates the first position on the basis of an integrated value of the intensity of the third electric signal and an integrated value of the intensity of the fourth electric signal.

2. The position detection sensor according to claim 1, wherein the first pixel pair group further includes a first transmission filter which covers the first pixel part and through which the light is transmitted, and a second transmission filter which covers
the second pixel part and through which the light is transmitted, the second pixel pair group further includes a third transmission filter which covers the third pixel part and through which the light is transmitted, and a fourth transmission filter which covers the fourth pixel part and through which the light is transmitted,
a transmittance of the light in the first transmission filter decreases as it is closer to the first end in the second direction,
a transmittance of the light in the second transmission filter increases as it is closer to the first end in the second direction,
a transmittance of the light in the third transmission filter decreases as it is closer to the second end in the first direction, and
a transmittance of the light in the fourth transmission filter increases as it is closer to the second end in the first direction.

3. The position detection sensor according to claim 1, wherein the first pixel pair group further includes a first light-shielding part that covers another portion of the first pixel part excluding one portion of the first pixel part and shields the light, and a second light-shielding part that covers another portion of the second pixel part excluding one portion of the second pixel part and shields the light,
the second pixel pair group further includes a third light-shielding part that covers another portion of the third pixel part excluding one portion of the third pixel part and shields the light, and a fourth light-shielding part that covers another portion of the fourth pixel part excluding one portion of the fourth pixel part and shields the light,
a width of the one portion of the first pixel part in the first direction decreases as it is closer to the first end in the second direction,
a width of the one portion of the second pixel part in the first direction increases as it is closer to the first end in the second direction, a width of the one portion of the third pixel part in the second direction decreases as it is closer to the second end in the first direction, and a width of the one portion of the fourth pixel part in the second direction increases as it is closer to the second end in the first direction.

4. The position detection sensor according to claim 1, a width of the first pixel part in the first direction decreases as it is closer to the first end in the second direction, a width of the second pixel part in the first direction increases as it is closer to the first end in the second direction, a width of the third pixel part in the second direction decreases as it is closer to the second end in the first direction, and a width of the fourth pixel part in the second direction increases as it is closer to the second end in the first direction.

5. The position detection sensor according to claim 1, wherein the first pixel part includes a plurality of first pixels arranged along the second direction, the second pixel part includes a plurality of second pixels arranged along the second direction, the third pixel part includes a plurality of third pixels arranged along the first direction, the fourth pixel part includes a plurality of fourth pixels arranged along the first direction, a width of the first pixels in the first direction is smaller as the first pixels are closer to the first end in the second direction, a width of the second pixels in the first direction is larger as the second pixels are closer to the first end in the second direction, a width of the third pixels in the second direction is smaller as the third pixels are closer to the second end in the first direction, and a width of the fourth pixels in the second direction is larger as the fourth pixels are closer to the second end in the first direction.

6. The position detection sensor according to claim 1, wherein the first pixel part includes a plurality of first pixels arranged along the second direction, the second pixel part includes a plurality of second pixels arranged along the second direction, the third pixel part includes a plurality of third pixels arranged along the first direction, the fourth pixel part includes a plurality of fourth pixels arranged along the first direction, the first pixel part includes a plurality of first amplifiers which are electrically connected to the plurality of first pixels and amplify intensities of electric signals generated in the plurality of first pixels, the second pixel part includes a plurality of second amplifiers which are electrically connected to the plurality of second pixels, and amplify intensities of electric signals generated in the plurality of second pixels, the third pixel part includes a plurality of third amplifiers which are electrically connected to the plurality of third pixels, and amplify intensities of electric signals generated in the plurality of third pixels, the fourth pixel part includes a plurality of fourth amplifiers which are electrically connected to the plurality of fourth pixels, and amplify intensities of electric signals generated in the plurality of fourth pixels, an amplification rate of the first amplifiers is smaller as the first pixels electrically connected to the first amplifiers are closer to the first end in the second direction, an amplification rate of the second amplifiers is larger as the second pixels electrically connected to the second amplifiers are closer to the first end in the second direction, an amplification rate of the third amplifiers is smaller as the third pixels electrically connected to the third amplifiers are closer to the second end in the first direction, and an amplification rate of the fourth amplifiers is larger as the fourth pixels electrically connected to the fourth amplifiers are closer to the second end in the first direction.

7. A position detection sensor that detects an incident position of light, comprising:

a first pixel group that includes a plurality of first pixel parts which are arranged along a first direction and generate a first electric signal corresponding to an incident light amount of the light;

a second pixel group that includes a plurality of second pixel parts which are arranged along a second direction intersecting the first direction and generate a second electric signal corresponding to an incident light amount of the light, the second pixel group intersecting the first pixel group; and a calculation unit that calculates a first position that is the incident position in the first direction, and a second position that is the incident position in the second direction, wherein in the first pixel part, as the incident position is closer to a first end of the first pixel group in the second direction, an intensity of the first electric signal decreases, in the second pixel part, as the incident position is closer to a second end of the second pixel group in the first direction, an intensity of the second electric signal decreases, and the first position is calculated on the basis of an integrated value of the intensity of the first electric signal, and the second position is calculated on the basis of an integrated value of the intensity of the second electric signal.

* * * * *